United States Patent
Wang et al.

(10) Patent No.: US 11,818,903 B2
(45) Date of Patent: Nov. 14, 2023

(54) SOLAR CELL, AND METHODS FOR PREPARING THE SOLAR CELL, SMART GLASSES, AND ELECTRONIC DEVICES

(71) Applicant: HUAWEI TECHNOLOGIES CO., LTD., Guangdong (CN)

(72) Inventors: Shuo Wang, Shanghai (CN); Kai Xin, Shanghai (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 0 days.

(21) Appl. No.: 17/824,409

(22) Filed: May 25, 2022

(65) Prior Publication Data

US 2022/0384751 A1    Dec. 1, 2022

(30) Foreign Application Priority Data

May 26, 2021   (CN) .......................... 202110578634.5

(51) Int. Cl.
   *H01L 31/044*     (2014.01)
   *H10K 30/82*      (2023.01)
   (Continued)

(52) U.S. Cl.
   CPC ........... *H10K 30/82* (2023.02); *H10K 30/451* (2023.02); *H10K 30/57* (2023.02)

(58) Field of Classification Search
   CPC .................. H01L 31/00–078; H10K 30/00–89
   (Continued)

(56) References Cited

U.S. PATENT DOCUMENTS 6,291,763 B1 *   9/2001   Nakamura ........... H01G 9/2022
                                                   429/111
2003/0230337 A1 * 12/2003  Gaudiana ............... H10K 39/10
                                                   136/256
(Continued)

FOREIGN PATENT DOCUMENTS

CN      102637826 A      8/2012
CN      102881459 A      1/2013
(Continued)

OTHER PUBLICATIONS

Mohammed Makha et al.,"Ternary semitransparent organic solar cells with a laminated top electrode", Science and Technology of Advanced Materials, 2017, vol. 18, No. 1, 68 75, Total 9 Pages.

(Continued)

*Primary Examiner* — Bach T Dinh
(74) *Attorney, Agent, or Firm* — WOMBLE BOND DICKINSON (US) LLP

(57) ABSTRACT

This application provides a solar cell, a method for preparing the solar cell, smart glasses, and an electronic device. The solar cell includes a first conductive layer, a second conductive layer, a first conductive lattice, a second conductive layer, and a functional layer. The functional layer is disposed between the first conductive layer and the second conductive layer, the functional layer is configured to absorb light and generate a photocurrent, and both the first conductive layer and the second conductive layer are configured to receive the photocurrent. The first conductive lattice is in contact with a surface that is of the first conductive layer. The second conductive lattice is in contact with the second conductive layer, and the first conductive lattice and the second conductive lattice are configured to output the photocurrent to the target device. This application can mitigate impact of a sheet resistance on cell efficiency.

14 Claims, 17 Drawing Sheets

(51) Int. Cl.
*H10K 30/00* (2023.01)
*H10K 30/57* (2023.01)

(58) Field of Classification Search
USPC .................................................. 136/243–265
See application file for complete search history.

(56) References Cited

U.S. PATENT DOCUMENTS

| | | | |
|---|---|---|---|
| 2006/0102974 A1* | 5/2006 | Chen | .................. H01L 31/0203 |
| | | | 257/434 |
| 2009/0266401 A1 | 10/2009 | Stangl et al. | |
| 2010/0252109 A1 | 10/2010 | Hong et al. | |
| 2013/0032204 A1* | 2/2013 | Gaudiana | ............... H10K 30/83 |
| | | | 257/E31.124 |
| 2017/0256715 A1 | 9/2017 | Wehlus et al. | |
| 2019/0385990 A1* | 12/2019 | Chen | ....................... G06F 1/163 |

FOREIGN PATENT DOCUMENTS

| | | |
|---|---|---|
| CN | 104521004 A | 4/2015 |
| CN | 106094257 A | 11/2016 |
| CN | 111312900 A | 6/2020 |

OTHER PUBLICATIONS

Mohammed Makhaa et al.,"A transparent, solvent-free laminated top electrode for perovskite solar cells", Science and Technology of Advanced Materials, 2016, vol. 17, No. 1, 260 266, Total 8 Pages.

* cited by examiner

SOLAR CELL, AND METHODS FOR PREPARING THE SOLAR CELL, SMART GLASSES, AND ELECTRONIC DEVICES

CROSS-REFERENCE TO RELATED APPLICATION

This application claims priority to Chinese Patent Application No. 202110578634.5, filed on May 26, 2021, which is hereby incorporated by reference in its entirety.

TECHNICAL FIELD

This application relates to the field of battery technologies, and in particular, to a solar cell, a method for preparing the solar cell, smart glasses, and an electronic device.

BACKGROUND

As novel thin-film solar cell technologies such as perovskite and organic solar cells are becoming more popular in people's life, increasing a size of the cell to meet an application requirement for a large-area cell is gradually being put on the agenda. In an existing thin-film solar cell, because a sum of sheet resistances of a top electrode and a bottom electrode is relatively large, efficiency of the device is significantly affected as a device effective area increases. Under a development trend of application of large-area solar cells, how to mitigate impact of a sheet resistance on cell efficiency after cell size enlargement is an issue to be continuously explored in the industry.

SUMMARY

Embodiments of this application provide a solar cell, a method for preparing the solar cell, smart glasses, and an electronic device, so as to mitigate impact of a sheet resistance on cell efficiency after cell size enlargement, thereby adapting to a development trend of application of large-area solar cells.

Currently, commercial solar cells are mainly silicon solar cells. However, manufacture costs of monocrystalline silicon solar cells are high; although polycrystalline silicon solar cells have high cost-effectiveness, they have disadvantages of large attenuation and a low lifetime. Therefore, thin-film solar cell technologies emerge accordingly. In an existing thin-film solar cell technology, relatively high photoelectric conversion efficiency can be achieved on a principled photovoltaic device having a small area (generally less than 0.1 cm$^2$). However, for practicality of solar cells, efficient large-area devices need to be obtained. An electrode used in a current solar cell has a relatively large sheet resistance, which significantly increases power conversion efficiency of a large-area device as an area of the device increases, leading to an increase in a loss of photo-generated carriers in a collection process. As a result, the power conversion efficiency of the large-area device rapidly decreases with the increase of the area of the device, and development of application of efficient large-area solar cells gradually encounters a bottleneck.

However, technical solutions provided in this application can effectively resolve the foregoing problem. Details are further described below.

According to a first aspect of this application, a solar cell is provided. The solar cell includes:

a first conductive layer, a second conductive layer, and a functional layer, where the first conductive layer and the second conductive layer are disposed in a laminated manner, the functional layer is disposed between the first conductive layer and the second conductive layer, the functional layer is configured to absorb light and generate a photocurrent, and both the first conductive layer and the second conductive layer are configured to receive the photocurrent generated by the functional layer;

a first conductive lattice, where one surface of the first conductive lattice is in contact with a surface that is of the first conductive layer and that faces away from the functional layer, and the first conductive lattice is configured to output the photocurrent to a target device; and a second conductive lattice, where the second conductive lattice is embedded in the functional layer, one surface of the second conductive lattice is in contact with the second conductive layer, and the second conductive lattice is configured to output the photocurrent to the target device.

In the technical solutions of this application, the solar cell may be understood as a photoelectric element capable of absorbing sunlight to directly generate a photocurrent. Photoelectric conversion efficiency of the solar cell is not affected by a sheet resistance. Therefore, an application requirement for a small area (for example, less than or equal to 0.1 cm$^2$) can be satisfied, and an application requirement for a large area (for example, greater than or equal to 1 cm$^2$) can also be satisfied. For example, the solar cell may be an organic solar cell, a quantum dot solar cell, a perovskite solar cell, or the like.

During preparation of a large-area solar cell, the solar cell can be cut into a plurality of small-area subcells by using a process such as laser patterning, and the plurality of subcells are connected in series to form a large-area solar cell in a form of a module or component. Alternatively, the solar cell may be a single complete large-area solar cell. In embodiments, this may be flexibly adjusted according to an application scenario, and is not strictly limited.

The functional layer may be understood as a layer structure for absorbing light and generating a photo-generated current. The solar cell has two electrodes capable of supplying power to the outside, which may be understood as transparent electrodes for collecting photo-generated currents and transmitting the photo-generated currents to the outside for power supply. The electrode indicates a thin film capable of conducting electricity and having high light transmittance in a visible light range, with excellent optical transmittance, conductivity, and stability. In addition, the two electrodes may be understood as positive and negative electrodes of the solar cell, and the two electrodes are introduced to implement a power supply function of the solar cell.

In embodiments, the first conductive lattice and the first conductive layer may jointly form a conductive part of one electrode, and the second conductive lattice and the second conductive layer may jointly form a conductive part of the other electrode. The following is described by using an example in which the solar cell includes a first electrode and a second electrode, the first conductive lattice and the first conductive layer may jointly form a conductive part of the first electrode, and the second conductive lattice and the second conductive layer may jointly form a conductive part of the second electrode.

For example, the first electrode may be an electrode on the side of a light receiving surface, and the second electrode may be an electrode on the side of a back surface. Incident light is incident on the functional layer from the first electrode, and the functional layer absorbs photons to generate electron-hole pairs under excitation, and extracts electrons and holes, and transfers them to the two electrodes, thereby implementing power supply to the outside. In this arrangement, the first electrode on the light receiving surface side may be a transparent conductive electrode, and the second electrode on the back surface side may be a semi-transparent or transparent conductive electrode. Certainly, the first electrode may alternatively be an electrode on the side of the back surface, and the second electrode may alternatively be an electrode on the side of the light receiving surface, which is not strictly limited.

In the first electrode, the first conductive layer is configured to receive a photocurrent generated by the functional layer, and the first conductive lattice is configured to output the photocurrent to the target device. To be specific, after the photocurrent enters the first electrode from the first conductive layer, the photocurrent can be collected by the nearby first conductive lattice and output to the outside for power supply during a lateral transfer process of the first conductive layer. It should be understood that the target device may be any device capable of achieving a charging function by receiving the photocurrent output from the first conductive lattice. For example, the target device may be but is not limited to a battery, a processor, a sensor, a communications module, or the like.

In the second electrode, the second conductive layer is configured to receive a photocurrent generated by the functional layer, and the second conductive lattice is configured to output the photocurrent to the target device. To be specific, after the photocurrent enters the second electrode from the second conductive layer, the photocurrent can be collected by the nearby second conductive lattice and output to the outside for power supply during a lateral transfer process of the second conductive layer. It should be understood that the target device may be any device capable of achieving a charging function by receiving the photocurrent output from the second conductive lattice. For example, the target device may be but is not limited to a battery, a processor, a sensor, a communications module, or the like.

It should be noted that, the first electrode and the second electrode each represent a positive electrode or a negative electrode of the solar cell, and the two electrodes cannot be directly electrically connected to be short-circuited, which accordingly causes the solar cell to fail to work. Therefore, the foregoing description about relative arrangement of the second electrode and the first electrode does not mean direct contact between the two conductive electrodes, but merely represents a relative position relationship between the two electrodes. That the second conductive lattice is embedded in the functional layer may be understood as: a relative position relationship between the second conductive lattice and the functional layer is that the second conductive lattice and the functional layer are disposed in a same layer, the second conductive lattice are surrounded by the functional layer, and there may be no actual direct connection relationship between the second conductive lattice and the functional layer.

The first conductive lattice and the second conductive lattice each may be understood as a meshed conductive line pattern formed through cross interconnection of conductive lines. The first conductive layer and the second conductive layer may be understood as planar layers that completely cover the first conductive lattice and the second conductive lattice, respectively. The first conductive layer is a layer structure, capable of being in direct contact with the functional layer, in the first electrode, and the second conductive layer is a layer structure, capable of being in direct contact with the functional layer, in the second electrode. The two conductive layers are mainly configured to collect photocurrents, such as electrons or holes, generated through light absorption by the functional layer, and to enable the photocurrents to be laterally transmitted in them. In addition, the first conductive layer completely covers the first conductive lattice, and the second conductive layer completely covers the second conductive lattice, which can also play a role in flattening the first conductive lattice and the second conductive lattice. Therefore, this reduces a risk of piercing of the functional layer caused by excessive roughness of the first conductive lattice and the second conductive lattice, and plays a role in surface modification. Materials of the first conductive layer and the second conductive layer may be selected based on energy level matching between the two conductive layers and the functional layer, so as to achieve better effects of photocurrent collection and transfer.

For example, a pattern shape of a single lattice of the first conductive lattice and the second conductive lattice may be one of a plurality of forms, for example, may be a regular hexagon, a rectangle, a square, a rhombus, a triangle, a trapezoid, or the like, so that the first conductive lattice or the second conductive lattice formed through interconnection of a plurality of lattices may be in a shape of a combination of one or more of the foregoing pattern shapes. The materials of the first conductive lattice and the second conductive lattice formed through interconnection of the plurality of lattices may include a combination of one or more of silver (Ag), copper (Cu), gold (Au), aluminum (Al), nickel (Ni), zinc (Zn), or the like. Alternatively, the materials of the first conductive lattice and the second conductive lattice may include a combination of one or more of doped conductive polymers, metal nanowires, carbon nanotubes, graphene, or metal oxides.

Based on the foregoing description, it should be understood that both the first conductive layer and the first conductive lattice are electrical conductors capable of allowing a current to pass. Therefore, the first conductive lattice is disposed, and the first conductive lattice is in contact with the first conductive layer, so that the first conductive lattice can be used as a main conductive structure, the first conductive layer can be used as an auxiliary conductive structure, and they cooperate with each other to form a conductive part in the first electrode. In other words, the first conductive layer and the first conductive lattice cooperate with each other to form a combination electrode.

In this arrangement, the first conductive lattice is introduced, so that after being collected by the first conductive layer, a photocurrent can be laterally transferred to the nearby first conductive lattice, and output through the first conductive lattice to the outside for power supply. A distance required for lateral transfer of the photocurrent in the first conductive layer can be greatly reduced, thereby reducing a loss in the first conductive layer, and minimizing an occurrence possibility of a problem that efficiency of the solar cell is severely affected by a relatively large sheet resistance of the first conductive layer. In addition, compared with single-form electrode construction by using a conductive layer, in the first electrode including a combination of the first conductive layer and the first conductive lattice, an overall sheet resistance of the first electrode can be greatly reduced due to high conductivity and high light transmittance of the first conductive lattice. Further, this minimizes an occurrence possibility of problems of a significant increase of a cell equivalent series resistance and a large decrease in a fill factor and a short-circuit current caused by a relatively large sheet resistance as a device effective area of the solar cell is enlarged, significantly mitigates impact of a sheet resistance on cell efficiency after cell size enlargement, and improves photoelectric conversion efficiency of the solar cell, thereby better adapting to a development trend of application of large-area solar cells.

Both the second conductive layer and the second conductive lattice are electrical conductors capable of allowing a current to pass. Therefore, the second conductive lattice is disposed, and the second conductive lattice is in contact with the second conductive layer, so that the second conductive lattice can be used as a main conductive structure, the second conductive layer can be used as an auxiliary conductive structure, and they cooperate with each other to form a conductive part in the second electrode. In other words, the second conductive layer and the second conductive lattice cooperate with each other to form a combination electrode.

In this arrangement, the second conductive lattice is introduced, so that after being collected by the second conductive layer, a photocurrent can be laterally transferred to the nearby second conductive lattice, and output through the second conductive lattice to the outside for power supply. A distance required for lateral transfer of the photocurrent in the second conductive layer can be greatly reduced, thereby reducing a loss in the second conductive layer, and minimizing an occurrence possibility of a problem that efficiency of the solar cell is severely affected by a relatively large sheet resistance of the second conductive layer. In addition, compared with single-form electrode construction by using a conductive layer, in the second electrode including a combination of the second conductive layer and the second conductive lattice, an overall sheet resistance of the second electrode can be greatly reduced due to high conductivity and high light transmittance of the second conductive lattice. Further, this minimizes an occurrence possibility of problems of a significant increase of a cell equivalent series resistance and a large decrease in a fill factor and a short-circuit current caused by a relatively large sheet resistance as a device effective area of the solar cell is enlarged, significantly mitigates impact of a sheet resistance on cell efficiency after cell size enlargement, and improves photoelectric conversion efficiency of the solar cell, thereby better adapting to a development trend of application of large-area solar cells.

Based on the foregoing description, it should be understood that because the first electrode and the second electrode each are a combination electrode of "conductive layer+conductive lattice", and the combination electrode can greatly reduce a sheet resistance of the corresponding electrode, a sum of sheet resistances of two electrodes can be controlled within several w/sq or less (which is, for example, less than or equal to 3 w/sq) when compared with an existing technology in which single-form electrode construction is used for two electrodes to form a relatively large sum of sheet resistances, which is tens of $\Omega$/sq or even reaches a hundred of $\Omega$/sq. Therefore, the sum of the sheet resistances of the two electrodes in the existing technology can be reduced by 1 to 2 orders of magnitude, the sum of the sheet resistances of the two electrodes can be greatly reduced, impact of the sheet resistance on cell efficiency after cell size enlargement is significantly mitigated, and photoelectric conversion efficiency is improved, thereby adapting to a development trend of large-area cell preparation.

In a possible embodiment, conductivity of the first conductive lattice is higher than conductivity of the first conductive layer, and conductivity of the second conductive lattice is higher than conductivity of the second conductive layer.

It should be noted that a result of comparison between the conductivity of the first conductive lattice and the conductivity of the first conductive layer may be obtained through measurement in a plurality of manners. For example, the sheet resistances of the first conductive layer and the first conductive lattice may be measured and compared to determine the result of comparison. For example, the sheet resistances of the first conductive lattice and the first conductive layer are compared to determine that the one with a smaller sheet resistance of the two has higher conductivity, and the one with a larger sheet resistance has lower conductivity.

Alternatively, a result of comparison between the conductivity of the first conductive lattice and the conductivity of the first conductive layer may be obtained by measuring and comparing resistivity of the first conductive layer and resistivity of the first conductive lattice. For example, resistivity of the first conductive lattice and resistivity of the first conductive layer are compared to determine that the one with smaller resistivity of the two has higher conductivity, and the one with larger resistivity has lower conductivity.

Alternatively, a result of comparison between the conductivity of the first conductive lattice and the conductivity of the first conductive layer may be obtained by measuring and comparing conductance of the first conductive layer and conductance of the first conductive lattice. For example, conductance of the first conductive lattice and conductance of the first conductive layer are compared to determine that the one with larger conductance of the two has higher conductivity, and the one with smaller conductance has lower conductivity.

It should be understood that the result of comparison between the conductivity of the first conductive lattice and the conductivity of the first conductive layer is not limited to being obtained through measurement in the foregoing listed manners. A manner in which the result of comparison between the conductivity of the first conductive lattice and the conductivity of the first conductive layer can be obtained through measurement shall fall within the protection scope of this application, and is not strictly limited.

In embodiments, the conductivity of the first conductive lattice is higher than the conductivity of the first conductive layer, which is a relative description based on comparison between the two. The first conductive lattice is a high-conductivity region, and the first conductive layer is a low-conductivity region. "High" and "low" in the high-conductivity region and the low-conductivity region represent relative concepts of the two regions, and merely represent relative conductivity performance of the two regions as conductive regions, but do not represent absolute conductivity performance of the conductive regions. The high-conductivity region and the low-conductivity region are relative to each other. To be specific, if there are two regions with different conductivity in one electrode, a region with higher conductivity is a high-conductivity region, and a region with lower conductivity is a low-conductivity region.

Therefore, this helps photocurrents converge from a region with lower conductivity to a region with higher conductivity, so that lateral transfer of the photocurrents in an entire region of the first electrode becomes more uniform, and a sheet resistance loss caused by non-uniform lateral transfer of a large range of photocurrents is effectively avoided. This helps improve photoelectric conversion efficiency of the cell, and efficiency improvement is significant, especially for a solar cell with a large area.

It should be noted that a result of comparison between the conductivity of the second conductive lattice and the conductivity of the second conductive layer may be obtained through measurement in a plurality of manners. For example, the sheet resistances of the second conductive layer and the second conductive lattice may be measured and compared to determine the result of comparison. For example, the sheet resistances of the second conductive lattice and the second conductive layer are compared to determine that the one with a smaller sheet resistance of the two has higher conductivity, and the one with a larger sheet resistance has lower conductivity.

Alternatively, a result of comparison between the conductivity of the second conductive lattice and the conductivity of the second conductive layer may be obtained by measuring and comparing resistivity of the second conductive layer and resistivity of the second conductive lattice. For example, resistivity of the second conductive lattice and resistivity of the second conductive layer are compared to determine that the one with smaller resistivity of the two has higher conductivity, and the one with larger resistivity has lower conductivity.

Alternatively, a result of comparison between the conductivity of the second conductive lattice and the conductivity of the second conductive layer may be obtained by measuring and comparing conductance of the second conductive layer and conductance of the second conductive lattice. For example, conductance of the second conductive lattice and conductance of the second conductive layer are compared to determine that the one with larger conductance of the two has higher conductivity, and the one with smaller conductance has lower conductivity.

It should be understood that the result of comparison between the conductivity of the second conductive lattice and the conductivity of the second conductive layer is not limited to being obtained through measurement in the foregoing listed manners. A manner in which the result of comparison between the conductivity of the second conductive lattice and the conductivity of the second conductive layer can be obtained through measurement shall fall within the protection scope of this application, and is not strictly limited.

In embodiments, the conductivity of the second conductive lattice is higher than the conductivity of the second conductive layer, which is a relative description based on comparison between the two. The second conductive lattice is a high-conductivity region, and the second conductive layer is a low-conductivity region. "High" and "low" in the high-conductivity region and the low-conductivity region represent relative concepts of the two regions, and merely represent relative conductivity performance of the two regions as conductive regions, but do not represent absolute conductivity performance of the conductive regions. The high-conductivity region and the low-conductivity region are relative to each other. To be specific, if there are two regions with different conductivity in one electrode, a region with higher conductivity is a high-conductivity region, and a region with lower conductivity is a low-conductivity region.

Therefore, this helps photocurrents converge from a region with lower conductivity to a region with higher conductivity, so that lateral transfer of the photocurrents in an entire region of the second electrode becomes more uniform, and a sheet resistance loss caused by non-uniform lateral transfer of a large range of photocurrents is effectively avoided. This helps improve photoelectric conversion efficiency of the cell, and efficiency improvement is significant, especially for a solar cell with a large area.

In a possible embodiment, the solar cell further includes a transparent layer. The transparent layer is in contact with a surface that is of the first conductive layer and that is away from the functional layer, and the first conductive lattice is embedded in the transparent layer.

It can be understood that the first electrode is an electrode on the side of the receiving surface, into which incident light can be emitted, and therefore, a requirement for transparency of the first electrode is relatively high. Therefore, the transparent layer is disposed in the first electrode, so that external light can be emitted from the transparent layer side with relatively high transmittance, and optical transmittance performance is good. The first conductive lattice is disposed in the transparent layer, so that a limited space size can be properly utilized, and the first conductive lattice is wrapped to form a layout arrangement of being embedded in the transparent layer, with high space utilization.

In embodiments, the transparent layer may be located on an outermost side of the solar cell, and the outermost side may be understood as a side, closest to the incident light, of the solar cell. In other words, the transparent layer is located on a side that is of the first conductive layer and that is away from the second conductive layer. The transparent layer includes a first contact surface, and the first contact surface is a surface that is on the transparent layer and that is in contact with the first conductive layer. The first contact surface is provided with a first accommodation groove, and the first accommodation groove is configured to accommodate the first conductive lattice. In other words, the first conductive lattice is surrounded by the transparent layer, and a visual effect that the transparent layer wraps the first conductive lattice can be presented.

It can be understood that the first accommodation groove is a patterned lattice-like trench, all lattices are interconnected, and a size and a shape of the first accommodation groove can be adapted to a size and a shape of the first conductive lattice, so as to be better in contact with the first conductive lattice and improve reliability of contact with the first conductive lattice. A specific size and shape of the first accommodation groove can be adjusted according to an actual requirement. This is not strictly limited in this embodiment of this application. For example, the first accommodation groove may be honeycomb-shaped.

Therefore, the groove is provided on the transparent layer to accommodate the first conductive lattice, so as to improve mechanical adhesion to the first conductive lattice, and minimize an adverse effect on the first electrode, with high reliability.

In a possible embodiment, a ratio of an area of a positive projection of the first conductive lattice onto the first conductive layer to an area of a positive projection of the transparent layer onto the first conductive layer is in a range of 0% to 20%.

In other words, a ratio of an area of a cross section of the first conductive lattice parallel to the transparent layer to an area of a cross section of the transparent layer is in a range of 0% to 20% (including the endpoint values). In other words, a coverage percentage of the first conductive lattice to the transparent layer may be in a range of 0% to 20% (including the endpoint values).

It can be understood that the first conductive lattice has no light transmittance, but the area of the first conductive lattice occupies 20% or less of the area of the transparent layer and is adjustable, so that overall light transmittance of the first electrode can be 80% or higher and is adjustable, so as to obtain a high-conductivity thin-film electrode with relatively high transmittance.

In a possible embodiment, a surface that is of the first conductive lattice and that faces the first conductive layer is coplanar with a surface that is of the transparent layer and that faces the first conductive layer.

In other words, the surface that is of the first conductive lattice and that faces the first conductive layer is aligned with the surface that is of the transparent layer and that faces the first conductive layer. In this arrangement, the first conductive lattice can be coplanar with the transparent layer and therefore has good flatness, so that the first conductive lattice has a surface appearance of good continuity and homogeneity, to effectively prevent the first conductive lattice from piercing the functional layer due to a convex step or high roughness, and further prevent a short circuit due to direction connection between the first electrode and the second electrode, and a problem that the cell cannot work normally.

In a possible embodiment, the transparent layer includes a substrate and a colloidal layer, the colloidal layer is located between the first conductive layer and the substrate, and the first conductive lattice is embedded in the colloidal layer.

It can be understood that the transparent layer may include a single-layer structure. In embodiments, when the transparent layer includes a single-layer structure, the transparent layer may be a transparent substrate. In this arrangement, the first conductive lattice can be directly prepared in the transparent substrate, a thickness is reduced when compared with a multi-layer structure, and in addition, a manufacturing process of a specific material is saved, thereby improving production efficiency.

Alternatively, the transparent layer may include a multi-layer structure. In embodiments, when the transparent layer includes a multi-layer structure, the transparent layer includes a substrate and a colloidal layer disposed in a laminated manner, and the first conductive lattice is located in the colloidal layer. To be specific, a surface that is of the colloidal layer and that is in contact with the first conductive layer is the first contact surface, and the first accommodation groove is disposed on the colloidal layer.

Therefore, a layer structure included in the transparent layer may be adjusted according to an actual requirement, to flexibly adapt to a multi-scenario application requirement.

In a possible embodiment, the solar cell further includes an insulation layer, and the insulation layer wraps the second conductive lattice.

It can be understood that, because the second electrode is also a conductive electrode, the second electrode cannot be in direct contact with the first electrode. Therefore, the insulation layer is disposed in the second electrode, to play a role in isolating the first conductive layer from the second conductive layer, thereby minimizing an occurrence possibility of a problem that the solar cell cannot work normally due to a short circuit caused by electrical connection between the first electrode and the second electrode. This plays a role in direct contact isolation between the first electrode and the second electrode, with high reliability. The second conductive lattice is disposed in the insulation layer, so that a limited space size can be properly utilized, and the second conductive lattice is wrapped to form a layout arrangement of being embedded in the insulation layer, with high space utilization.

In a possible embodiment, the insulation layer has a plurality of through-holes, and the functional layer is located in the plurality of through-holes.

For example, the insulation layer has a same shape as the second conductive lattice. To be specific, the insulation layer can be in a lattice-like shape matching the second conductive lattice. In other words, the insulation layer does not completely cover the first conductive layer, but covers only a part of the first conductive layer.

It should be noted that, in the technical solutions of this application, a shape of the through-hole is not limited, and the shape of the through-hole may cooperate with a shape of a single lattice of the second conductive lattice to present a diversified representation form. For example, the shape of the through-hole may be a regular hexagon, a rectangle, a square, a rhombus, a triangle, or a trapezoid. For example, the shape of a single lattice of the second conductive lattice is a regular hexagon, and the through-hole is also in a shape of a regular hexagon.

In embodiments, the insulation layer has a plurality of through-holes penetrating the insulation layer, and the plurality of through-holes are spaced apart and are independent of each other, so that the insulation layer is in a meshed shape with a plurality of hollow lattices. On the basis that the insulation layer is fully adapted to the shape of the second conductive lattice, a size of space occupied by the insulation layer can be reduced, so as to avoid waste of space of a device structure of the solar cell, and implement device miniaturization of the solar cell. In addition, the lattice-like insulation layer can free up particular space to accommodate the functional layer, which helps maximize space utilization in a limited spatial layout.

The insulation layer has a plurality of through-holes arranged to be spaced apart, and further, the insulation layer is connected between the first conductive layer and the second conductive layer. Therefore, a spacing region can be formed between the first conductive layer and the second conductive layer. The spacing region may be understood as space jointly occupied by a plurality of through-holes. The functional layer is located in the spacing region and is connected between the first conductive layer and the second conductive layer.

In this arrangement, the functional layer can be arranged in a same layer as the insulation layer that wraps the second conductive lattice. On the basis that the functional layer is in contact with both the first conductive layer and the second conductive layer, an overall thickness of the solar cell can be reduced, which helps achieve a development trend of miniaturization and thinness of the solar cell. In addition, direct contact with the second conductive lattice can be avoided through isolation by using the insulation layer, so as to minimize an occurrence possibility of problems caused by direct contact between the functional layer and the second conductive lattice, such as direct recombination of carriers, existence of a leakage current, a decrease in cell performance, and possible erosion of the functional layer by the electrodes. Therefore, a transfer path of "the functional layer—the second conductive layer—the second conductive lattice" of a photocurrent can be smoothly achieved, and interference between the parts can be avoided.

In a possible embodiment, at least a part of the first conductive layer is located in the plurality of through-holes, and/or at least a part of the second conductive layer is located in the plurality of through-holes.

It can be understood that, because the functional layer is correspondingly filled in the through-holes of the insulation layer, a thickness of the functional layer needs to be set in consideration of a depth of the through-hole. The depth of the through-hole may be understood as a dimension perpendicular to a direction of the second conductive layer, and may also be understood as a thickness of the insulation layer. Moreover, considering that a thickness of an active layer of the solar cell may be relatively light and thin, a thickness of the entire functional layer needs to be controlled at a relatively low level. Therefore, in this embodiment of this application, the first conductive layer and/or the second conductive layer may also be disposed in the spacing region, so that the functional layer, the first conductive layer, and/or the second conductive layer cooperate with each other to jointly match the thickness of the insulation layer. Therefore, the thickness of the functional layer can be maintained at a relatively good level, and the spacing region in the insulation layer is jointly filled, which helps improve device stability and reliability of the solar cell.

For example, at least a part of the first conductive layer is located in the spacing region. To be specific, the first conductive layer covers the first conductive lattice, and further, on a side that is of the first conductive layer and that is away from the first conductive lattice, a part corresponding to a position of the through-hole of the insulation layer protrudes toward the direction of the second conductive layer, so as to extend into the through-hole of the insulation layer.

In this arrangement, the functional layer and the first conductive layer can cooperate with each other to jointly match the thickness of the insulation layer. On the basis that the thickness of the functional layer is maintained at a relatively good level, the functional layer and the first conductive layer can jointly fill the spacing region in the insulation layer, which helps improve device stability and reliability of the solar cell. In addition, properly increasing a thickness of the first conductive layer can further reduce the sheet resistance of the first electrode, which helps mitigate impact of the sheet resistance on cell efficiency after cell size enlargement, thereby achieving efficient preparation of large-area solar cells.

Alternatively, at least a part of the second conductive layer is located in the spacing region. To be specific, the second conductive layer covers the second conductive lattice, and further, on a side that is of the second conductive layer and that faces the first conductive lattice, a part corresponding to a position of the through-hole of the insulation layer protrudes toward a direction of the first conductive layer, so as to extend into the through-hole of the insulation layer.

In this arrangement, the functional layer and the second conductive layer can cooperate with each other to jointly match the thickness of the insulation layer. On the basis that the thickness of the functional layer is maintained at a relatively good level, the functional layer and the second conductive layer can jointly fill the spacing region in the insulation layer, which helps improve device stability and reliability of the solar cell. In addition, properly increasing a thickness of the second conductive layer can also further reduce the sheet resistance of the second electrode, which helps reduce a series resistance, and improve the fill factor and current density, so as to effectively improve energy conversion efficiency.

Alternatively, both at least a part of the first conductive layer and at least a part of the second conductive layer are located in the spacing region. To be specific, the first conductive layer covers the first conductive lattice, and further, on a side that is of the first conductive layer and that is away from the first conductive lattice, a part corresponding to a position of the through-hole of the insulation layer protrudes toward the direction of the second conductive layer, so as to extend into the through-hole of the insulation layer. The second conductive layer covers the second conductive lattice, and further, on a side that is of the second conductive layer and that faces the first conductive lattice, a part corresponding to a position of the through-hole of the insulation layer protrudes toward a direction of the first conductive layer, so as to extend into the through-hole of the insulation layer.

In this arrangement, the functional layer, the first conductive layer, and the second conductive layer can cooperate with each other to jointly match the thickness of the insulation layer. On the basis that the thickness of the functional layer is maintained at a relatively good level, the functional layer, the first conductive layer, and the second conductive layer can jointly fill the spacing region in the insulation layer, which helps improve device stability and reliability of the solar cell. In addition, properly increasing a thickness of the first conductive layer and a thickness of the second conductive layer can further reduce the sheet resistances of the first electrode and the second electrode, which helps mitigate impact of the sheet resistance on cell efficiency after cell size enlargement, thereby improving photoelectric conversion efficiency, and adapting to a development trend of large-area cell preparation.

In a possible embodiment, the functional layer includes a first transport layer, a light absorption layer, and a second transport layer that are sequentially disposed in a laminated manner. The first transport layer is in contact with the first conductive layer, and the second transport layer is in contact with the second conductive layer. One of the first transport layer and the second transport layer is configured to transport electrons, and the other is configured to transport holes.

In other words, the first transport layer, the light absorption layer, and the second transport layer are sequentially disposed in a laminated manner in a direction from the first conductive layer to the second conductive layer.

In the technical solutions of this application, the functional layer can generate electron-hole pairs. In embodiments, one of the first transport layer and the second transport layer is configured to transport electrons, and the other is configured to transport holes. To be specific, when the first transport layer transports electrons, the second transport layer transports holes; when the first transport layer transports holes, the second transport layer transports electrons.

In addition, the solar cell can be an organic solar cell, a perovskite solar cell, a quantum dot solar cell, or the like depending on a material of the light absorption layer of the solar cell. For example, when the solar cell is an organic solar cell, the material of the light absorption layer of the solar cell includes a bicomponent or multicomponent blend material of at least one electron donor material and at least one electron acceptor material. The electron donor material may be polymeric PTB7-Th, PBDB-T, PM6, D18, or a derivative thereof, or the like, and the electron acceptor material may be PCBM, ITIC, Y6, or a derivative thereof, or the like. When the solar cell is a perovskite solar cell, the material of the light absorption layer of the solar cell may include methylamine lead iodine, methyl ether lead iodine, cesium lead iodine, and three-dimensional or two-dimensional perovskite with a plurality of composite cations and composite anions, and the like. When the solar cell is a quantum dot solar cell, the material of the light absorption layer of the solar cell may be quantum dots, and the material may in embodiments include perovskite quantum dots, lead sulfur (e.g., selenide), cadmium sulfide, indium phosphide, and the like.

It can be understood that solar cells can be classified into a conventional structure and an inverted structure according to capabilities of extracting electrons or holes in a cell by a first transport layer and a second transport layer of a solar cell. For example, in a conventional structure of a perovskite solar cell, the first transport layer is an electron transport layer, and the second transport layer is a hole transport layer. In an inverted structure of a perovskite solar cell, the first transport layer is a hole transport layer, and the second transport layer is an electron transport layer.

It should be noted that different materials of the light absorption layer merely correspond to different types of solar cells, and which one of the two transport layers transports electrons or transports holes also merely corresponds to one of the two conventional and inverted device structures of solar cells. In the technical solutions of this application, selection of the material of the light absorption layer, and specific objects (e.g., holes and electrons) that the two transport layers are responsible for transporting are not strictly limited.

Based on the foregoing description, it should be understood that a working process of the functional layer may be briefly summarized as follows: Under illumination, the light absorption layer absorbs radiated photon energy to generate photo-generated excitons (e.g., electron-hole pairs), and the photo-generated excitons are decomposed to generate free carriers (e.g., electrons and holes). The electrons and holes respectively diffuse to a transport layer for collecting electrons and a transport layer for collecting holes, and are collected, and finally, a current is formed in an external circuit.

In a possible embodiment, a thickness of the second conductive lattice is less than or equal to a thickness of the first conductive lattice.

The thickness of the first conductive lattice may be understood as a dimension of the first conductive lattice in a direction perpendicular to the first conductive layer. In embodiments, the dimension is a vertical distance between a point on a body of the first conductive lattice farthest from the first conductive layer and the first conductive layer. The thickness of the second conductive lattice may be understood as a dimension of the second conductive lattice in a direction perpendicular to the second conductive layer. In embodiments, the dimension is a vertical distance between a point on a body of the second conductive lattice farthest from the second conductive layer and the second conductive layer.

It can be understood that, for the solar cell, the thickness of the functional layer is relatively thin. The functional layer is connected between the first conductive layer and the second conductive layer, and the second conductive lattice is located between the first conductive layer and the second conductive layer. In other words, the functional layer and the second conductive lattice are disposed in a same layer. In this arrangement, accordingly, the thickness of the second conductive lattice cannot be set as excessively large as the thickness of the first conductive lattice. The thickness of the second conductive lattice is controlled and adjusted to adapt to the thickness of the functional layer, so as to fully satisfy an application requirement for an efficient large-area solar cell, with high reliability.

According to a second aspect of this application, a method for preparing a solar cell is further provided. The method includes:

preparing a first conductive lattice and a first conductive layer, where the first conductive lattice is in contact with the first conductive layer, the first conductive layer is configured to receive a photocurrent generated by a functional layer, and the first conductive lattice is configured to output the photocurrent to a target device; and preparing a second conductive lattice, a second conductive layer, and the functional layer on the first conductive layer, where the second conductive layer and the first conductive layer are disposed in a laminated manner, the functional layer is disposed between the first conductive layer and the second conductive layer, the second conductive lattice is embedded in the functional layer, one surface of the second conductive lattice is in contact with the second conductive layer, the functional layer is configured to absorb light and generate a photocurrent, the second conductive layer is configured to receive the photocurrent generated by the functional layer, and the second conductive lattice is configured to output the photocurrent to the target device.

In a possible embodiment, the preparing a first conductive lattice and a first conductive layer includes:

providing a transparent layer;

forming the first conductive lattice embedded in the transparent layer, where at least a part of a surface of the first conductive lattice is exposed on the transparent layer; and forming the first conductive layer that covers the transparent layer and is in contact with the first conductive lattice.

In a possible embodiment, the preparing a second conductive lattice, a second conductive layer, and the functional layer on the first conductive layer includes:

forming an original insulation layer on a side that is of the first conductive layer and that is away from the first conductive lattice;

forming the second conductive lattice embedded in the original insulation layer, where at least a part of a surface of the second conductive lattice is exposed on the original insulation layer; and etching the original insulation layer to form an insulation layer that wraps the second conductive lattice, where the insulation layer has a plurality of through-holes;

forming, in the plurality of through-holes, the functional layer that is in contact with the first conductive layer; and forming the second conductive layer that covers the functional layer and is in contact with the second conductive lattice.

Based on the foregoing description, it should be understood that in the structure of the solar cell proposed in this method, in terms of a preparation sequence, the first conductive lattice and the second conductive lattice may be preferentially prepared, and then the functional layer is filled in a spacing region of the insulation layer. This structure avoids problems of insufficient mechanical adhesion and poor electrical contact commonly encountered when a conductive lattice electrode is hot pressed on a prepared cell as a transparent top electrode by using a lamination method. Therefore, this also avoids a problem of low charge extraction efficiency or energy level matching of an active material possibly caused when a conductive adhesive (for example, PEDOT:PSS/sorbitol) with a relatively large thickness is usually used to provide mechanical adhesion and an electrical contact function, so as to improve carrier extraction efficiency and the like. In addition, a preparation process is simple. This helps reduce preparation costs and makes it possible to prepare an efficient large-area solar cell.

According to a third aspect of this application, smart glasses are further provided. The smart glasses include an electronic component and the solar cell described above, or include a solar cell obtained by using the method for preparing a solar cell described above. The solar cell is configured to supply power to the electronic component.

The solar cell may be applicable to any field requiring preparation of a large-area semitransparent thin-film solar cell device, such as a wearable device, a smart consumer electronic device, a vehicle, a photovoltaic building integration, or an internet of things. The solar cell may be applied to preparation of a lens, a display screen, or a transparent housing in the foregoing device. For example, the wearable device may be, but is not limited to, smart glasses, smart goggles, augmented reality (AR), virtual reality (VR), a smartwatch, a smart band, a head-mounted wireless headset, a wireless bone-conduction headset, a neck-strap wireless headset, and a true wireless stereo (TWS) headset. The smart consumer electronic device may be, but is not limited to, a mobile phone, a tablet computer, or a notebook computer.

In a possible embodiment, the solar cell may be independently prepared as a lens of the smart glasses, so as to have functions of meeting a visual environment requirement, presenting a clear field of view, and supplying power to various electronic components of the smart glasses, and the like.

For example, the smart glasses further include a lens frame, and the lens frame may include lens brackets and lens legs connected to the lens brackets. The lens legs accommodate electronic components such as an energy storage battery, a processor, a sensor, and a communications module. The lens bracket is provided with an accommodation groove, and the accommodation groove can be configured to accommodate a solar cell prepared as a lens. The accommodation groove is provided with a through-hole, through which positive and negative electrodes of the solar cell prepared as a lens can pass, and electrical connection to each electronic component in the lens leg is implemented in a connection form such as a hinge, so as to supply power to each electronic component.

When the solar cell is prepared as a lens of the smart glasses, a single lens can reach a large area of, for example, 20 cm² to 30 cm², and an available power of, for example, tens to hundreds of milliwatts under standard illumination, so as to satisfy a power consumption requirement of the smart glasses. In addition, a sum of sheet resistances of a top electrode and a bottom electrode is relatively small, which can greatly mitigate impact of enlargement of an effective area of the cell on photoelectric conversion efficiency, thereby achieving efficient preparation of large-area solar cells.

In another possible embodiment, the solar cell may be integrated with a lens substrate to form a lens of the smart glasses. In other words, the lens of the smart glasses includes the lens substrate and the solar cell disposed on the lens substrate.

According to a fourth aspect of this application, an electronic device is further provided. The electronic device includes an electrical module and the solar cell described above, or includes a solar cell obtained by using the method for preparing a solar cell described above. The solar cell is configured to supply power to the electrical module.

DESCRIPTION OF EMBODIMENTS

Figure 1:
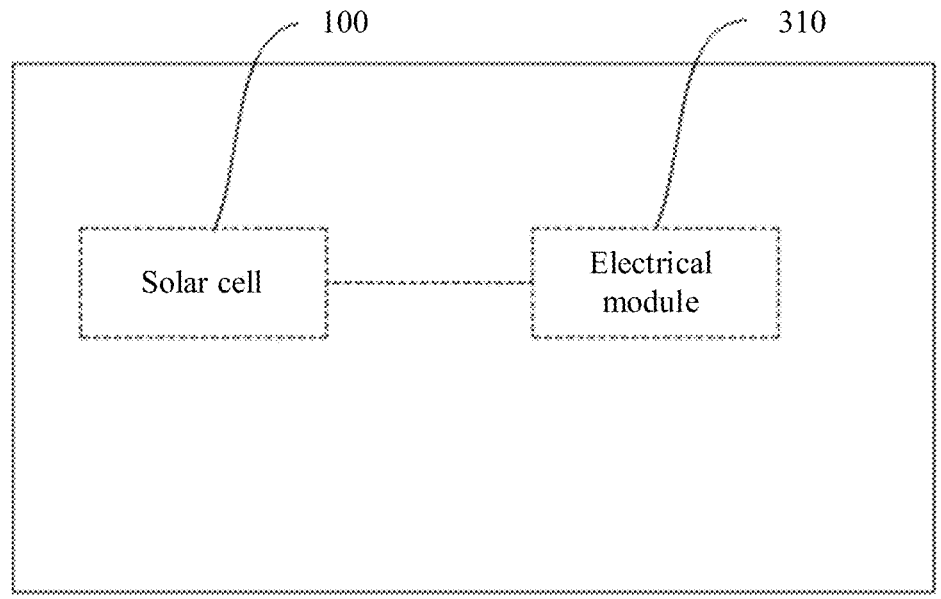
FIG. 1 is a schematic diagram of a structure of an electronic device according to an embodiment of this application.

For ease of understanding, terms in the embodiments of this application are first explained.

The term "and/or" describes only an association relationship for describing associated objects and represents that three relationships may exist. For example, A and/or B may represent the following three cases: Only A exists, both A and B exist, and only B exists.

"A plurality of" means "two or more".

Connection: It should be understood in a broad sense. For example, if A is connected to B, A may be directly connected to B, or A and B can be indirectly connected through an intermediate medium.

Sheet resistance: It is an important parameter for describing conductivity of a conductive thin film. It is assumed that a square conductive thin film (a length is equal to a width) has a sheet resistance equal to thin-film resistivity divided by a thin-film thickness, independent of an area of the thin film. A unit is ohms/sq ($\Omega$/sq).

Device effective area: It is a region area covered by both a top electrode and a bottom electrode, and is an area in which photocurrents can be generated and collected through light absorption.

Series resistance: It is a parameter of a circuit model that is created equivalent to a solar cell based on a photovoltaic effect of a PN junction, and includes a sheet resistance of a bottom electrode of the cell, a sheet resistance of a top electrode of the cell, an equivalent resistance of an effective area of the cell, and equivalent resistances of film layers in the middle of the cell.

The following clearly describes embodiments of this application with reference to the accompanying drawings.

As novel thin-film solar cell technologies such as perovskite and organic solar cells are becoming more popular in people's life, the novel thin-film solar cell technologies have a wide range of application scenarios because of their excellent characteristics such as high efficiency, flexibility, transparency and adjustable colors. Currently, a device size of a novel thin-film solar cell with high efficiency is basically at a laboratory device level of less than or equal to 0.1 $cm^2$. As a size of an applied device increases, photoelectric conversion efficiency decreases rapidly due to impact of a sheet resistance of the electrode. This leads to a failure of the cell to meet a power requirement of the applied device with a relatively large size.

Based on this, embodiments of this application provide a solar cell, smart glasses using the solar cell, and an electronic device, so as to mitigate impact of sheet resistance on cell efficiency after cell size enlargement, thereby adapting to a development trend of application of large-area solar cells.

The solar cell may be applicable to any field requiring preparation of a large-area semitransparent thin-film solar cell device, such as a wearable device, a smart consumer electronic device, a vehicle, a photovoltaic building integration, or an internet of things. The solar cell may be applied to preparation of a lens, a display screen, or a transparent housing in the foregoing device. For example, the wearable device may be, but is not limited to, smart glasses, smart goggles, augmented reality (AR), virtual reality (VR), a smartwatch, a smart band, a head-mounted wireless headset, a wireless bone-conduction headset, a neck-strap wireless headset, a true wireless stereo (TWS) headset, and the like. The smart consumer electronic device may be, but is not limited to, a mobile phone, a tablet computer, a notebook computer, or the like.

In embodiments of this application, the solar cell may be understood as a photoelectric element capable of absorbing sunlight to directly generate a photocurrent. Photoelectric conversion efficiency of the solar cell is not affected by a sheet resistance. Therefore, an application requirement for a small area (for example, less than or equal to 0.1 $cm^2$) can be satisfied, and an application requirement for a large area (for example, greater than or equal to 1 $cm^2$) can also be satisfied. For example, a solar cell 100 may be an organic solar cell, a quantum dot solar cell, a perovskite solar cell, or the like.

During preparation of a large-area solar cell, the solar cell can be cut into a plurality of small-area subcells by using a process such as laser patterning, and the plurality of subcells are connected in series to form a large-area solar cell in a form of a module or component. Alternatively, the solar cell may be a single complete large-area solar cell. In embodiments, this may be flexibly adjusted according to an application scenario, and is not strictly limited in embodiments of this application.

Refer to FIG. 1. The electronic device 300 may include an electrical module 310 and a solar cell 100. The solar cell 100 is electrically connected to the electrical module 310, and may be configured to supply power to the electrical module 310. For example, the electronic device 300 may be the wearable device or the smart consumer electronic device in the foregoing description. The electrical module 310 may include an electrical module including a battery, a processor, a sensor, a communications module, or the like.

It should be noted that, FIG. 1 is merely intended to schematically show a connection relationship between the electrical module 310 and the solar cell 100, but is not intended to In embodiments limit a connection position, a specific structure, and a quantity of the devices. The structure shown in this embodiment of this application does not constitute a specific limitation on the electronic device 300. In some other embodiments of this application, the electronic device 300 may include more or fewer components than those shown in the figure, or some components may be combined, or some components may be split, or different component arrangements may be used. The components shown in the figure may be implemented in hardware, software, or a combination of software and hardware.

Figure 2:
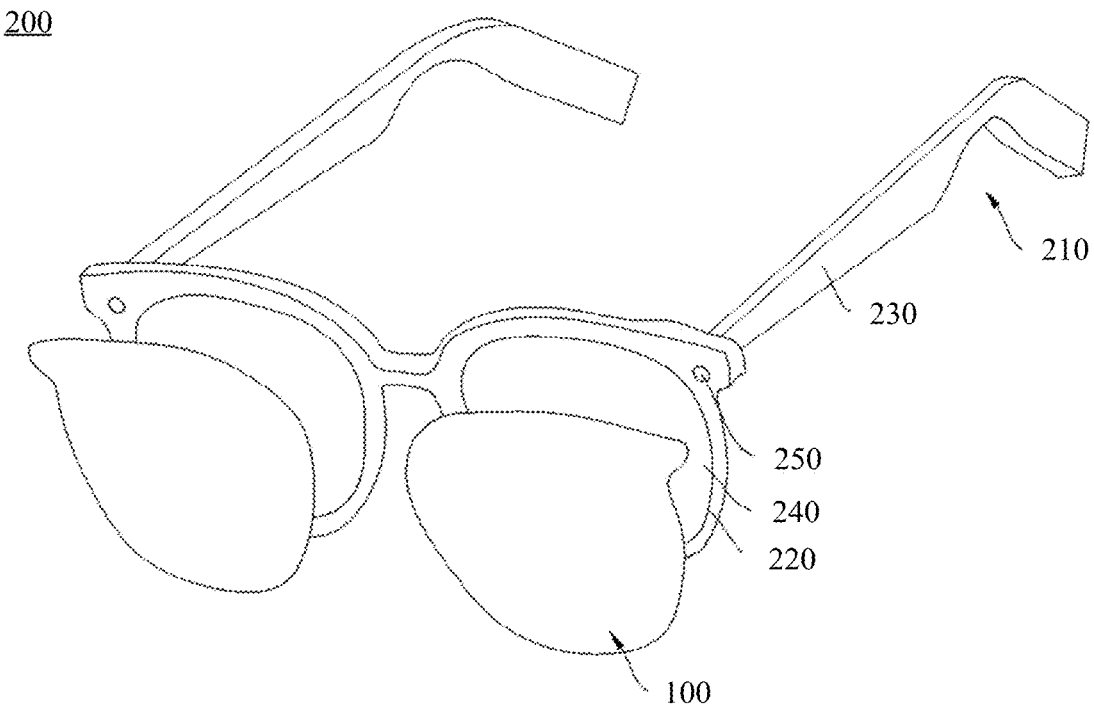
FIG. 2 is a schematic diagram of a structure of smart glasses according to an embodiment of this application.

Refer to FIG. 2. Smart glasses 200 may include a solar cell 100, a lens frame 210, and an electronic component (not shown in the figure).

The lens frame 210 can carry and fix the solar cell 100, and can provide strong support for installation stability and reliability of the solar cell 100. A shape of the lens frame 210 may correspondingly vary according to an actual application scenario of the smart glasses 200, provided that the lens frame 210 is capable of limiting the solar cell 100. The electronic component may be accommodated in the lens frame 210 and electrically connected to the solar cell 100, so that the solar cell 100 supplies power to the electronic component. For example, the electronic component may be an energy storage battery, a processor, a sensor, or a communications module.

It should be noted that, FIG. 2 is merely intended to schematically show a connection relationship between the solar cell 100, the lens frame 210, and the electronic component, but is not intended to In embodiments limit a connection position, a specific structure, and a quantity of the devices. The structure illustrated in this embodiment of this application does not constitute a specific limitation on the smart glasses 200. In some other embodiments of this application, the smart glasses 200 may include more or fewer components than those shown in the figure, or some components may be combined, or some components may be split, or different component arrangements may be used. The components shown in the figure may be implemented in hardware, software, or a combination of software and hardware.

In another possible embodiment, the solar cell 100 may be integrated with a lens substrate to form a lens of the smart glasses 200. In other words, the lens of the smart glasses 200 includes the lens substrate and the solar cell 100 disposed on the lens substrate.

Figure 3:
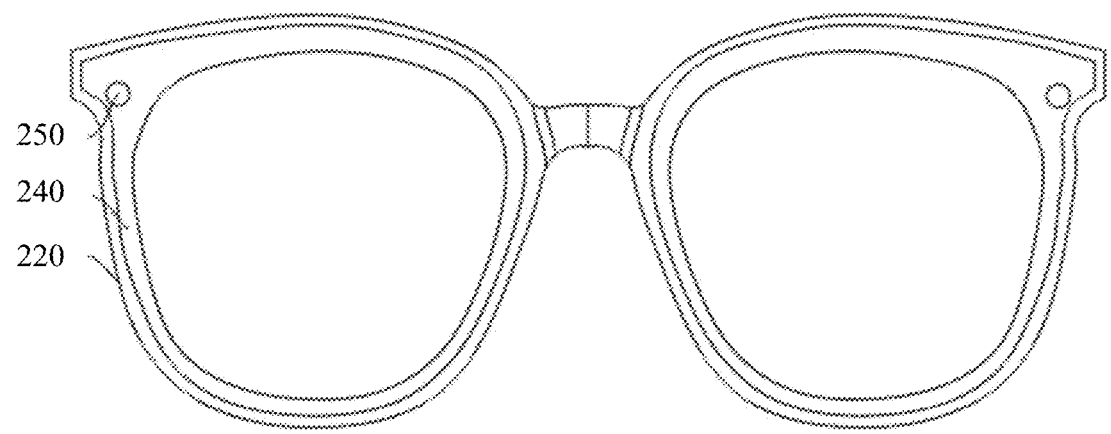
FIG. 3 is a schematic diagram of a structure of a part of the smart glasses shown in FIG. 1.

With reference to FIG. 2 and FIG. 3, in another possible embodiment, the solar cell 100 may be independently prepared as a lens of the smart glasses 200, so as to have functions of meeting a visual environment requirement, presenting a clear field of view, and supplying power to various electronic components of the smart glasses 200, and the like. The lens frame 210 may be configured to carry a lens prepared by using the solar cell 100, and accommodate various electronic components, such as a processor, a sensor, and a communications module, included in the smart glasses 200.

For example, the lens frame 210 may include lens brackets 220 and lens legs 230 connected to the lens brackets 220. The lens legs 230 accommodate electronic components such as an energy storage battery, a processor, a sensor, and a communications module. The lens bracket 220 is provided with an accommodation groove 240, and the accommodation groove can be configured to accommodate a solar cell 100 prepared as a lens. The accommodation groove is provided with a through-hole 250, through which positive and negative electrodes of the solar cell 100 prepared as a lens can pass, and electrical connection to each electronic component in the lens leg 230 is implemented in a connection form such as a hinge, so as to supply power to each electronic component.

It can be understood that, when the solar cell 100 is prepared as a lens of the smart glasses 200, a single lens can reach a large area of, for example, 20 cm$^2$ to 30 cm$^2$, and an available power of, for example, tens to hundreds of milliwatts under standard illumination, so as to satisfy a power consumption requirement of the smart glasses 200. In addition, a sum of sheet resistances of a top electrode and a bottom electrode is relatively small, which can greatly mitigate impact of enlargement of an effective area of the cell on photoelectric conversion efficiency, thereby achieving efficient preparation of large-area solar cells 100. Principles of achieving the foregoing functions of the solar cell 100 are described below with reference to a structure of the solar cell 100.

Figure 4:
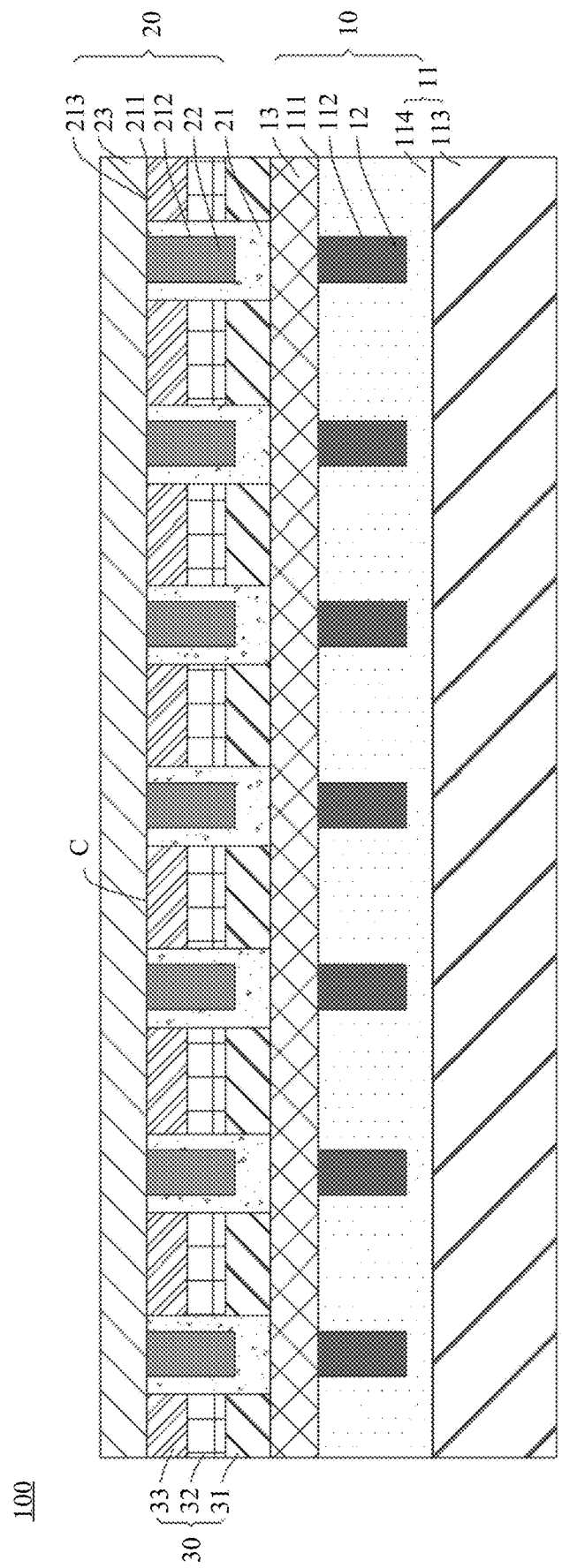
FIG. 4 is a schematic diagram of a structure of a solar cell according to an embodiment of this application.
Figure 5:
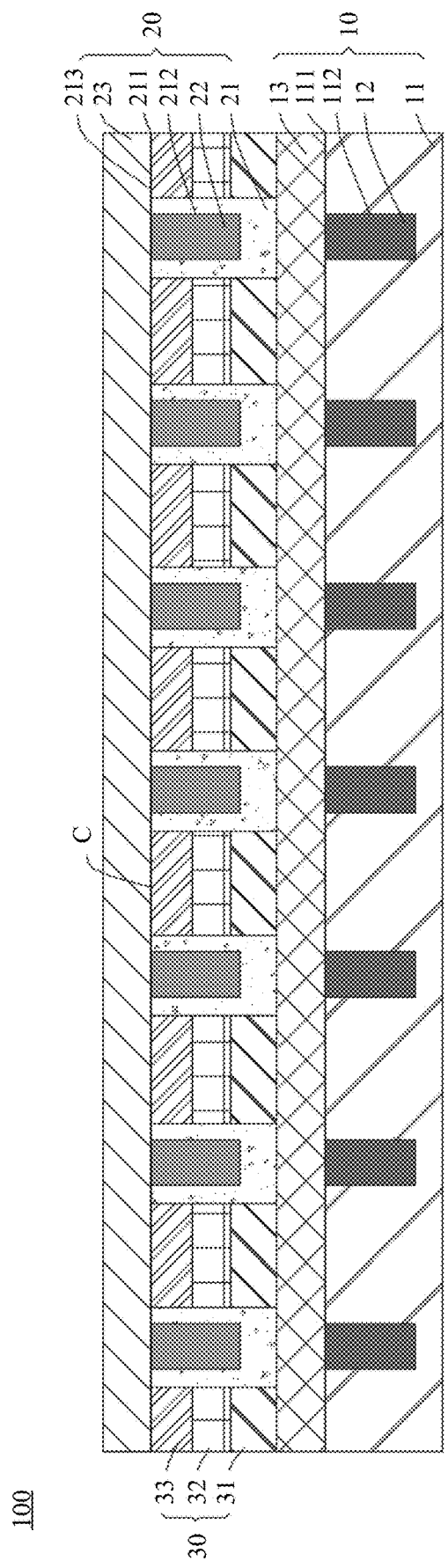
FIG. 5 is a schematic diagram of another structure of a solar cell according to an embodiment of this application.

With reference to FIG. 4 and FIG. 5, the solar cell 100 includes a first electrode 10, a second electrode 20, and a functional layer 30 that are relatively disposed. The functional layer 30 may be understood as a layer structure for absorbing light and generating a photo-generated current. The first electrode 10 and the second electrode 20 may be understood as transparent electrodes for receiving photo-generated currents and transmitting the photo-generated currents to the outside for power supply. The electrode indicates a thin film capable of conducting electricity and having high light transmittance in a visible light range, with excellent optical transmittance, conductivity, and stability. The two electrodes may be understood as positive and negative electrodes of the solar cell 100, and the first electrode 10 and the second electrode 20 are introduced to implement a power supply function of the solar cell 100.

Further, the first electrode 10 may be referred to as one of a top electrode and a bottom electrode, and the second electrode 20 may be referred to as the other of the top electrode and the bottom electrode. The top electrode and the bottom electrode may indicate a position relationship of the top electrode and the bottom electrode in the solar cell 100, and may indicate a preparation sequence of first preparing the bottom electrode and then preparing the top electrode during preparation of the solar cell 100.

For example, the first electrode 10 may be an electrode on the side of a light receiving surface, and the second electrode 20 may be an electrode on the side of a backlight surface. Incident light is incident on the functional layer 30 from the first electrode 10, and the functional layer 30 absorbs photons to generate electron-hole pairs under excitation, and extracts electrons and holes, and transfers them to the two electrodes, thereby implementing power supply to the outside. In this arrangement, the first electrode 10 on the light receiving surface side may be a transparent conductive electrode, and the second electrode 20 on the back surface side may be a semitransparent or transparent conductive electrode. Certainly, the first electrode 10 may alternatively be an electrode on the side of the back surface, and the second electrode 20 may alternatively be an electrode on the side of the light receiving surface, which is not strictly limited.

Figure 6:
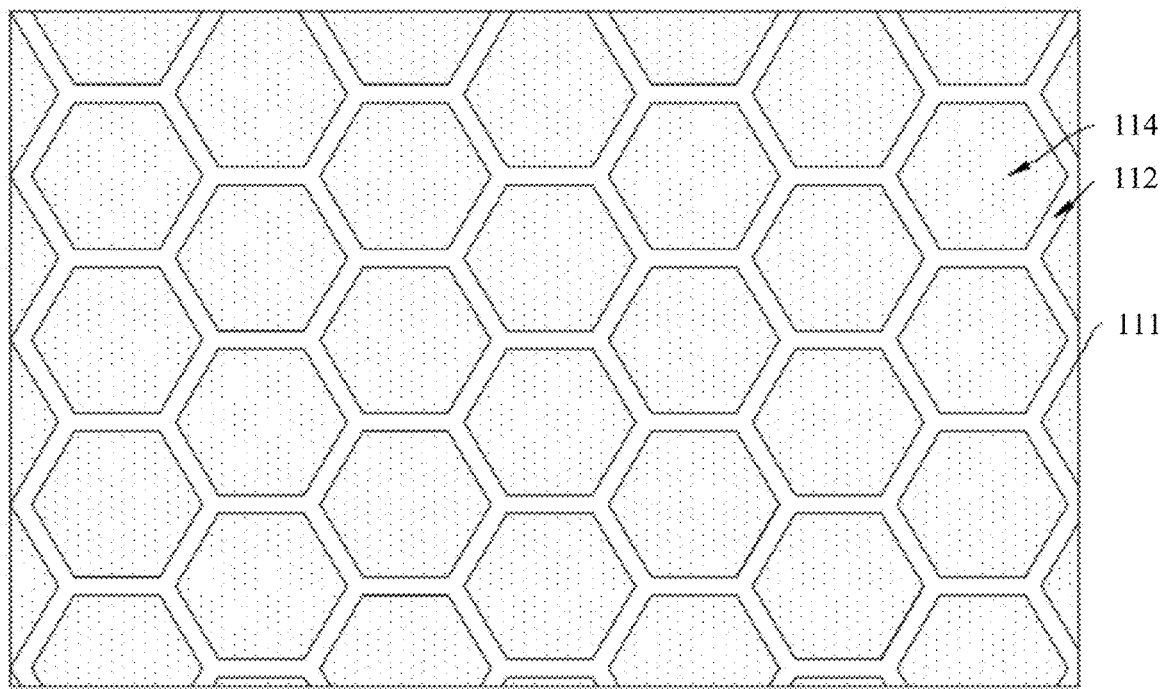
FIG. 6 is a schematic sectional top view of a first electrode of a solar cell according to an embodiment of this application.
Figure 7:
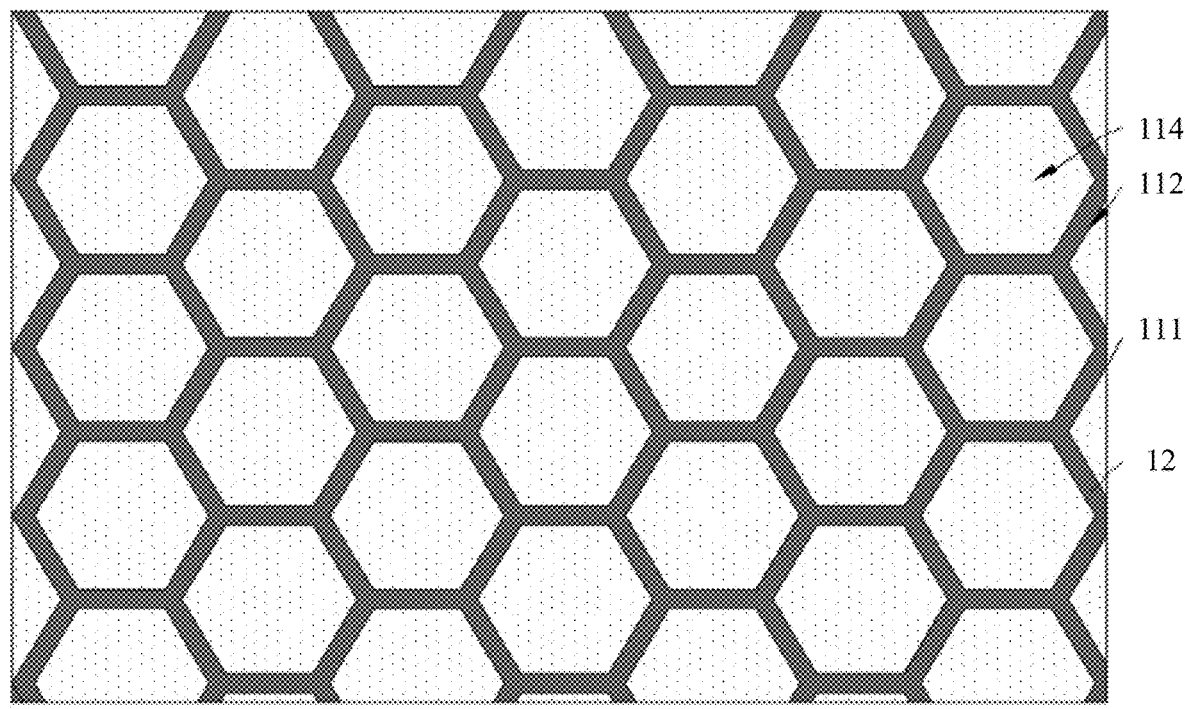
FIG. 7 is another schematic sectional top view of a first electrode of a solar cell according to an embodiment of this application.

With reference to FIG. 4, FIG. 6, and FIG. 7, the first electrode 10 includes a transparent layer 11, a first conductive layer 13, and a first conductive lattice 12. The transparent layer 11 and the first conductive layer 13 are disposed in a laminated manner, and the first conductive lattice 12 is embedded in the transparent layer 11 and is in contact with the first conductive layer 13.

It can be understood that incident light can be emitted into the first electrode 10, and therefore a requirement for average visible transmittance (AVT) of the first electrode 10 is relatively high. Therefore, the transparent layer 11 is disposed in the first electrode 10, so that external light can be emitted from the transparent layer 11 side with relatively high transmittance, and optical transmittance performance is good. The first conductive lattice 12 is disposed in the transparent layer 11, so that a limited space size can be properly utilized, and the first conductive lattice 12 is wrapped to form a layout arrangement of being embedded in the transparent layer 11, with high space utilization.

Figure 8:
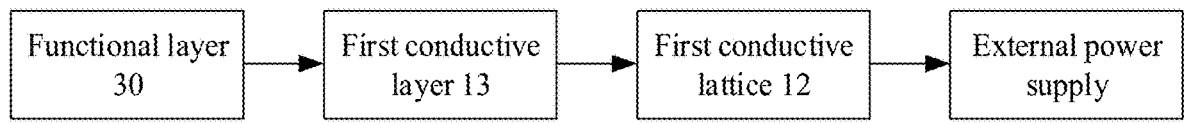
FIG. 8 is a simple schematic diagram of photocurrent transfer of a first electrode of a solar cell according to an embodiment of this application.

In the first electrode 10, the first conductive layer 13 is configured to receive a photocurrent generated by the functional layer 30, and the first conductive lattice 12 is configured to output the photocurrent to a target device. In embodiments, refer to FIG. 8. After the photocurrent enters the first conductive layer 13 from the functional layer 30, the photocurrent can be collected by the nearby first conductive lattice 12 and output to the outside for power supply during a lateral transfer process of the first conductive layer 13. For example, a leading wire contact of the first electrode 10 may be disposed on the first conductive lattice 12, and finally, power supply to the outside is implemented through the leading wire contact disposed on the first conductive lattice 12.

It should be understood that the target device may be any device capable of achieving a charging function by receiving the photocurrent output from the first conductive lattice 12. For example, the target device may be the electrical module 310 in the foregoing electronic device 300, or the target device may be the electronic component in the foregoing smart glasses 200. For example, the target device may be but is not limited to a battery, a processor, a sensor, a communications module, or the like.

In this embodiment of this application, conductivity of the first conductive lattice 12 is higher than conductivity of the first conductive layer 13, which is a relative description based on comparison between the two. The first conductive lattice 12 is a high-conductivity region, and the first conductive layer 13 is a low-conductivity region. "High" and "low" in the high-conductivity region and the low-conductivity region represent relative concepts of the two regions, and merely represent relative conductivity performance of the two regions as conductive regions, but do not represent absolute conductivity performance of the conductive regions. The high-conductivity region and the low-conductivity region are relative to each other. To be specific, if there are two regions with different conductivity in one electrode, a region with higher conductivity is a high-conductivity region, and a region with lower conductivity is a low-conductivity region.

Therefore, this helps photocurrents converge from a region with lower conductivity to a region with higher conductivity, so that lateral transfer of the photocurrents in an entire region of the first electrode 10 becomes more uniform, and a sheet resistance loss caused by non-uniform lateral transfer of a large range of photocurrents is effectively avoided. This helps improve photoelectric conversion efficiency of the cell, and efficiency improvement is significant, especially for a solar cell 100 with a large area.

It should be noted that a result of comparison between the conductivity of the first conductive lattice 12 and the conductivity of the first conductive layer 13 may be obtained through measurement in a plurality of manners. For example, sheet resistances of the first conductive layer 13 and the first conductive lattice 12 may be measured and compared to determine the result of comparison. For example, the sheet resistances of the first conductive lattice 12 and the first conductive layer 13 are compared to determine that the one with a smaller sheet resistance of the two has higher conductivity, and the one with a larger sheet resistance has lower conductivity.

Alternatively, a result of comparison between the conductivity of the first conductive lattice 12 and the conductivity of the first conductive layer 13 may be obtained by measuring and comparing resistivity of the first conductive layer 13 and resistivity of the first conductive lattice 12. For example, resistivity of the first conductive lattice 12 and resistivity of the first conductive layer 13 are compared to determine that the one with smaller resistivity of the two has higher conductivity, and the one with larger resistivity has lower conductivity.

Alternatively, a result of comparison between the conductivity of the first conductive lattice 12 and the conductivity of the first conductive layer 13 may be obtained by measuring and comparing conductance of the first conductive layer 13 and conductance of the first conductive lattice 12. For example, conductance of the first conductive lattice 12 and conductance of the first conductive layer 13 are compared to determine that the one with larger conductance of the two has higher conductivity, and the one with smaller conductance has lower conductivity.

It should be understood that the result of comparison between the conductivity of the first conductive lattice 12 and the conductivity of the first conductive layer 13 is not limited to being obtained through measurement in the foregoing listed manners. A manner in which the result of comparison between the conductivity of the first conductive lattice 12 and the conductivity of the first conductive layer 13 can be obtained through measurement shall fall within the protection scope of this application, and is not strictly limited.

With reference to FIG. 4, FIG. 6, and FIG. 7, in this embodiment of this application, the transparent layer 11 may be located on an outermost side of the solar cell 100, and the outermost side may be understood as a side, closest to the incident light, of the solar cell 100. In other words, the transparent layer 11 is located on the light receiving surface side. The transparent layer 11 includes a first contact surface 111, and the first contact surface 111 is a surface that is on the transparent layer 11 and that is in contact with the first conductive layer 13. The first contact surface 111 is provided with a first accommodation groove 112, and the first accommodation groove 112 is configured to accommodate the first conductive lattice 12. In other words, the first conductive lattice 12 is surrounded by the transparent layer 11, and a visual effect that the transparent layer 11 wraps the first conductive lattice 12 can be presented.

It can be understood that, as shown in FIG. 6 and FIG. 7, the first accommodation groove 112 is a patterned lattice-like trench, all lattices are interconnected, and a size and a shape of the first accommodation groove 112 can be adapted to a size and a shape of the first conductive lattice 12, so as to be better in contact with the first conductive lattice 12 and improve reliability of contact with the first conductive lattice 12. A specific size and shape of the first accommodation groove 112 can be adjusted according to an actual requirement. This is not strictly limited in this embodiment of this application. For example, the first accommodation groove 112 may be honeycomb-shaped.

Therefore, the groove is provided on the transparent layer 11 to accommodate the first conductive lattice 12, so as to improve mechanical adhesion to the first conductive lattice 12, and minimize an adverse effect on the first electrode 10, with high reliability.

In a possible embodiment, as shown in FIG. 5, the transparent layer 11 may include a single-layer structure. In embodiments, when the transparent layer 11 includes a single-layer structure, the transparent layer 11 may be a transparent substrate. In this arrangement, the first conductive lattice 12 can be directly prepared in the transparent substrate, a thickness is reduced when compared with a multi-layer structure, and in addition, a manufacturing process of a specific material is saved, thereby improving production efficiency.

In another possible embodiment, as shown in FIG. 4, the transparent layer 11 may include a multi-layer structure. In embodiments, when the transparent layer 11 includes a multi-layer structure, the transparent layer 11 includes a substrate 113 and a colloidal layer 114 disposed in a laminated manner, and the first conductive lattice 12 is located in the colloidal layer 114. To be specific, a surface that is of the colloidal layer 114 and that is in contact with the first conductive layer 13 is the first contact surface 111, and the first accommodation groove 112 is disposed on the colloidal layer 114.

For example, a material of the colloidal layer 114 may be a colloid material formed after liquid curing, such as a thermoplastic high-molecular polymer, a photocurable polymer, or a thermocurable polymer.

Based on the foregoing description, it should be understood that a specific structure of the transparent layer 11 is not limited in this embodiment of this application, and the layer structure of the transparent layer 11 may be adjusted according to an actual requirement, to flexibly adapt to a multi-scenario application requirement.

With reference to FIG. 4 and FIG. 7, the first conductive lattice 12 is embedded in the first accommodation groove 112, that is, the first conductive lattice 12 is embedded in the transparent layer 11. The first conductive lattice 12 may understood as a meshed conductive line pattern formed through cross interconnection of conductive lines.

For example, a pattern shape of a single lattice of the first conductive lattice 12 may be one of a plurality of forms, for example, may be a regular hexagon, a rectangle, a square, a rhombus, a triangle, a trapezoid, or the like, so that the first conductive lattice 12 formed through interconnection of a plurality of lattices may be in a shape of a combination of one or more of the foregoing pattern shapes. A material of the first conductive lattice 12 formed through interconnection of the plurality of lattices may include a combination of one or more of silver (Ag), copper (Cu), gold (Au), aluminum (Al), nickel (Ni), zinc (Zn), or the like. Alternatively, a material of the first conductive lattice 12 may include a combination of one or more of doped conductive polymers, metal nanowires, carbon nanotubes, graphene, metal oxides, or the like.

In this arrangement, the first conductive lattice 12 is embedded in the transparent layer 11, and can be wrapped by the transparent layer 11, to obtain good protection performance, which facilitates protection against interference from an external environmental factor, with strong scratch resistance. In addition, because parts of the first conductive lattice 12 are cross-connected, there is no contact resistance between lines in the first conductive lattice 12. This can minimize an occurrence possibility of problems of a conductivity performance decrease and a sheet resistance increase caused due to a contact resistance between lines, and helps maintain the sheet resistance of the first electrode 10 at a relatively low level while relatively high light transmittance is maintained.

The conductivity and the light transmittance of the first conductive lattice 12 can be adjusted by adjusting a size of a single lattice, a line width between lattices, a thickness of the conductive lattice, and the like. This not only can avoid, as much as possible, occurrence of a problem that photoelectric conversion efficiency of the solar cell 100 is affected by mutual restriction between the light transmittance and the conductivity, but also can obtain a high-conductivity (for example, the sheet resistance is less than 1 Ω/sq) thin-film electrode with relatively high transmittance (for example, greater than 80%), so as to better cater preparation of the bottom electrode of the large-area solar cell 100.

For example, a thickness range of the first conductive lattice 12 may be a range of 0.5 μm to 15 μm (including the endpoint values). A thickness of the first conductive lattice 12 may be understood as a dimension of the first conductive lattice 12 in a direction perpendicular to the first conductive layer 13. In embodiments, the dimension is a vertical distance between a point on a body of the first conductive lattice 12 farthest from the first conductive layer 13 and the first conductive layer 13. A line width range of the first conductive lattice 12 may be a range of 0.5 μm to 10 μm (including the endpoint values).

Refer to FIG. 4. Because the first conductive lattice 12 needs to be in contact with the first conductive layer 13, at least a part (for example, a part of a surface) of the first conductive lattice 12 needs to be exposed on the transparent layer 11, so as to ensure that the first conductive lattice 12 can be in direct contact with the first conductive layer 13 for mutual conduction.

For example, a surface that is of the first conductive lattice 12 and that faces the first conductive layer 13 is coplanar with a surface that is of the transparent layer 11 and that faces the first conductive layer 13. In other words, the surface that is of the first conductive lattice 12 and that faces the first conductive layer 13 is aligned with the surface that is of the transparent layer 11 and that faces the first conductive layer 13. In this arrangement, the first conductive lattice 12 can be coplanar with the transparent layer 11 and therefore has good flatness, so that the first conductive lattice 12 has a surface appearance of good continuity and homogeneity, to effectively prevent the first conductive lattice 12 from piercing the functional layer 30 due to a convex step or high roughness, and further prevent a short circuit due to direction connection between the first electrode 10 and the second electrode 20, and a problem that the cell cannot work normally.

In addition, a ratio of an area of a positive projection of the first conductive lattice 12 onto the first conductive layer 13 to an area of a positive projection of the transparent layer 11 onto the first conductive layer 13 is in a range of 0% to 20% (including the endpoint values). In other words, a ratio of an area of a cross section of the first conductive lattice 12 parallel to the transparent layer 11 to an area of a cross section of the transparent layer 11 is in a range of 0% to 20% (including the endpoint values). In other words, area coverage of the first conductive lattice 12 on the transparent layer 11 may be in the range of 0% to 20% (including the endpoint value). The area coverage of the first conductive lattice 12 on the transparent layer 11 is a percentage of an area occupied by the first conductive lattice 12 on the transparent layer 11 to a total area of the transparent layer 11.

It can be understood that the first conductive lattice 12 has no light transmittance, but the area of the first conductive lattice 12 occupies 20% or less of the area of the transparent layer 11 and is adjustable, so that overall light transmittance of the first electrode 10 can be 80% or higher and is adjustable, so as to obtain a high-conductivity thin-film electrode with relatively high transmittance.

Still refer to FIG. 4. The first conductive layer 13 covers the transparent layer 11 and is in contact with the first conductive lattice 12. In other words, the first conductive layer 13 can be in contact with the first conductive lattice 12 for conduction.

The first conductive layer 13 may be understood as a planar layer completely covering the first conductive lattice 12. The first conductive layer 13 is a layer structure, capable of being in direct contact with the functional layer 30, in the first electrode 10, and is mainly configured to collect photocurrents, such as electrons or holes, generated through light absorption by the functional layer 30, and to enable the photocurrents to be laterally transmitted in them. In addition, the first conductive layer 13 completely covers the first conductive lattice 12, which can also play a role in flattening the first conductive lattice 12. Therefore, this reduces a risk of piercing of the functional layer 30 caused by excessive roughness of the first conductive lattice 12, and plays a role in surface modification. A material of the first conductive layer 13 may be selected based on energy level matching between the first conductive layer 13 and the functional layer 30, so as to achieve better effects of photocurrent collection and transfer.

For example, the material of the first conductive layer 13 may be a transparent conductive oxide (TCO), such as an indium tin oxide (ITO), a fluorine-doped tin oxide (FTO), an aluminum-doped zinc oxide (AZO), an antimony-doped tin oxide (ATO), a gallium-doped zinc oxide (GZO), or a boron-doped zinc oxide (BZO). Alternatively, the material of the first conductive layer 13 may be metal or an alloy. Alternatively, the material of the first conductive layer 13 may be a thin-layer composite of metal or an alloy and a TCO. Alternatively, the material of the first conductive layer 13 may be a thin-layer composite of metal or an alloy and a metal oxide, such as a molybdenum oxide, a zinc oxide, or a tungsten oxide. Alternatively, the material of the first conductive layer 13 may be a composite of an organic matter and an ITO, such as copper phthalocyanine (CuPc)/ITO, zinc phthalocyanine (ZnPc)/ITO, CuPc/lithium (Li)/ITO, or bathocuproine (BCP)/Li/ITO. Alternatively, the material of the first conductive layer 13 may be a combination of one or more of a conductive polymer (PEDOT: PSS), a carbon nanotube (CNT), graphene, or the like.

In this embodiment of this application, the conductivity of the first conductive lattice 12 is higher than the conductivity of the first conductive layer 13. Therefore, when a photocurrent collected by the first conductive layer 13 is laterally transmitted in the first conductive layer 13, the photocurrent is collected by the nearby first conductive lattice 12 and finally output to the outside for power supply.

Based on the foregoing description, it should be understood that both the first conductive layer 13 and the first conductive lattice 12 are electrical conductors capable of allowing a current to pass. Therefore, the first conductive lattice 12 is disposed, and the first conductive lattice 12 is in contact with the first conductive layer 13, so that the first conductive lattice 12 can be used as a main conductive structure, the first conductive layer 13 can be used as an auxiliary conductive structure, and they cooperate with each other to form a conductive part in the first electrode 10. In other words, the first conductive layer 13 and the first conductive lattice 12 cooperate with each other to form a combination electrode.

In this arrangement, the conductivity of the first conductive lattice 12 is higher than the conductivity of the first conductive layer 13. Therefore, the first conductive lattice 12 is introduced, so that after being collected by the first conductive layer 13, a photocurrent can be laterally transferred to the nearby first conductive lattice 12, and output through the first conductive lattice 12 to the outside for power supply. A distance required for lateral transfer of the photocurrent in the first conductive layer 13 can be greatly reduced, thereby reducing a loss in the first conductive layer 13, and minimizing an occurrence possibility of a problem that efficiency of the solar cell 100 is severely affected by a relatively large sheet resistance of the first conductive layer 13. In addition, compared with single-form electrode construction by using a conductive layer, in the first electrode 10 including a combination of the first conductive layer 13 and the first conductive lattice 12, an overall sheet resistance of the first electrode 10 can be greatly reduced due to high conductivity and high light transmittance of the first conductive lattice 12. Further, this minimizes an occurrence possibility of problems of a significant increase of a cell equivalent series resistance and a large decrease in a fill factor and a short-circuit current caused by a relatively large sheet resistance as a device effective area of the solar cell 100 is enlarged, significantly mitigates impact of a sheet resistance on cell efficiency after cell size enlargement, and improves photoelectric conversion efficiency of the solar cell 100, thereby better adapting to a development trend of application of large-area solar cells 100.

Figure 9:
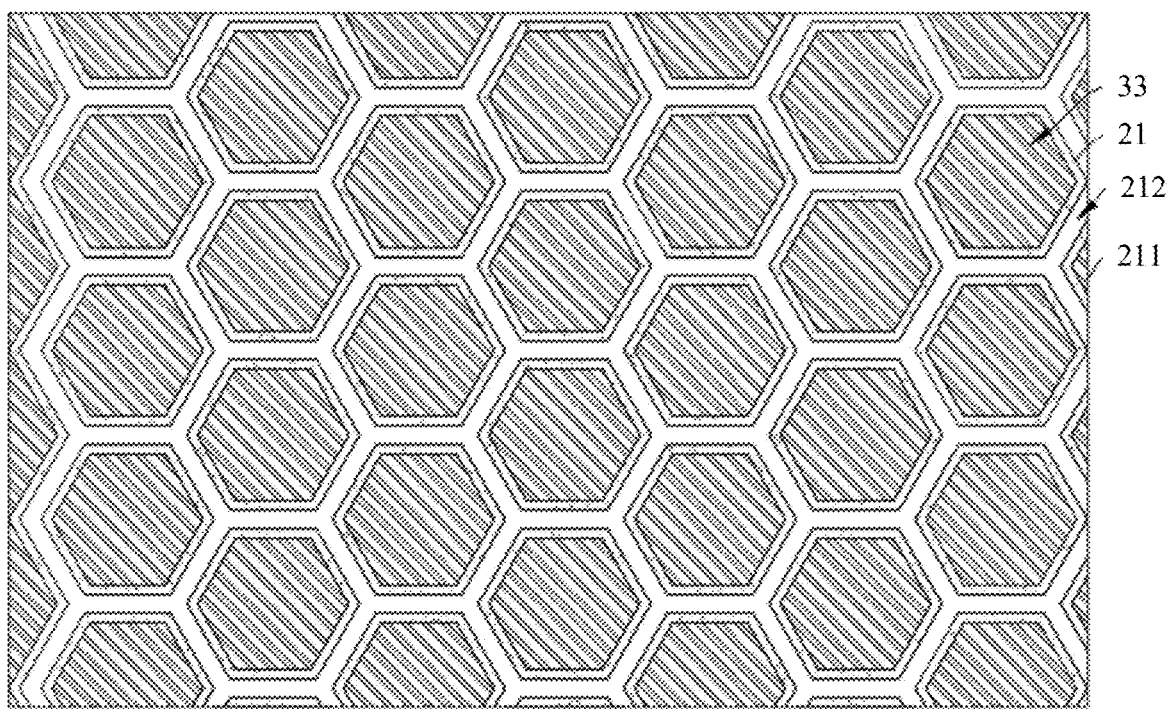
FIG. 9 is a schematic sectional top view of a second electrode of a solar cell according to an embodiment of this application.
Figure 10:
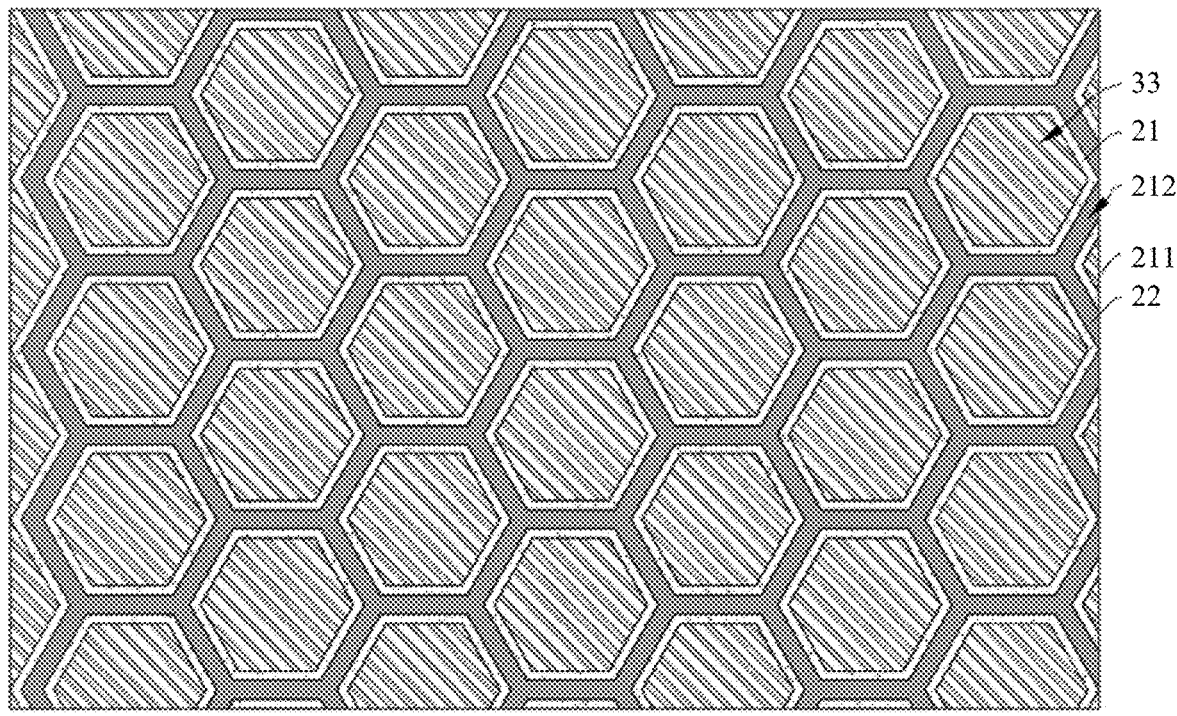
FIG. 10 is another schematic sectional top view of a second electrode of a solar cell according to an embodiment of this application.

With reference to FIG. 4, FIG. 9, and FIG. 10, the second electrode 20 is laminated on the first electrode 10, that is, the second electrode 20 and the first electrode 10 are disposed in a laminated manner. It should be noted that, the first electrode 10 and the second electrode 20 each represent a positive electrode or a negative electrode of the solar cell 100, and the two electrodes cannot be directly electrically connected to be short-circuited, which accordingly causes the solar cell 100 to fail to work. Therefore, the foregoing description about laminated arrangement of the second electrode 20 and the first electrode 10 does not mean direct contact between the two conductive electrodes, but merely represents a relative position relationship between the two electrodes.

In embodiments, the second electrode 20 includes an insulation layer 21, a second conductive lattice 22, and a second conductive layer 23. The insulation layer 21 is connected between the first conductive layer 13 and the second conductive layer 23, and plays a role in isolating the first conductive layer 13 from the second conductive layer 23. The second conductive lattice 22 is embedded in the functional layer 30. It should be noted that, that the second conductive lattice 22 is embedded in the functional layer 30 may be understood as: a relative position relationship between the second conductive lattice 22 and the functional layer 30 is that the second conductive lattice 22 and the functional layer 30 are disposed in a same layer, the second conductive lattice 22 are surrounded by the functional layer 30, and there may be no actual direct connection relationship between the second conductive lattice 22 and the functional layer 30. In embodiments, the second conductive lattice 22 is located in the insulation layer 21, one end of the second conductive lattice 22 is in contact with the second conductive layer 23, and the other end of the second conductive lattice 22 is insulated from the first conductive layer 13 by using the insulation layer 21.

It can be understood that, because the second electrode 20 is also a conductive electrode, the second electrode 20 cannot be in direct contact with the first electrode 10. Therefore, the insulation layer 21 is disposed in the second electrode 20, so as to minimize an occurrence possibility of a problem that the solar cell 100 cannot work normally due to a short circuit caused by electrical connection between the first electrode 10 and the second electrode 20. This plays a role in direct contact isolation between the first electrode 10 and the second electrode 20, with high reliability. The second conductive lattice 22 is disposed in the insulation layer 21, so that a limited space size can be properly utilized, and the second conductive lattice 22 is wrapped to form a layout arrangement of being embedded in the insulation layer 21, with high space utilization.

Figure 11:
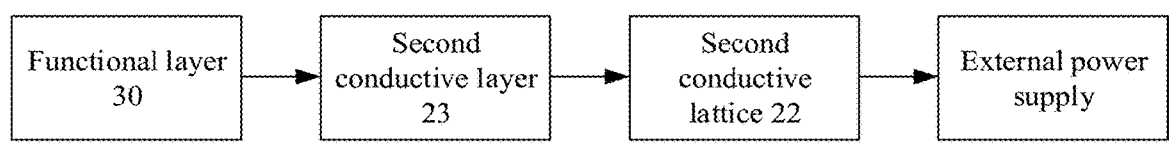
FIG. 11 is a simple schematic diagram of photocurrent transfer of a second electrode of a solar cell according to an embodiment of this application.

In the second electrode 20, the second conductive layer 23 is configured to receive a photocurrent generated by the functional layer 30, and the second conductive lattice 22 is configured to output the photocurrent to the target device. In embodiments, refer to FIG. 11. After the photocurrent enters the second conductive layer 23 from the functional layer 30, the photocurrent can be collected by the nearby second conductive lattice 22 and output to the outside for power supply during a lateral transfer process of the second conductive layer 23. For example, a leading wire contact of the second electrode 20 may be disposed on the second conductive lattice 22, and finally, power supply to the outside is implemented through the leading wire contact disposed on the second conductive lattice 22.

It should be understood that the target device may be any device capable of achieving a charging function by receiving the photocurrent output from the second conductive lattice 22. For example, the target device may be the electrical module 310 in the foregoing electronic device 300, or the target device may be the electronic component in the foregoing smart glasses 200. For example, the target device may be but is not limited to a battery, a processor, a sensor, a communications module, or the like.

In embodiments, the conductivity of the second conductive lattice 22 is higher than the conductivity of the second conductive layer 23, which is a relative description based on comparison between the two. The second conductive lattice 22 is a high-conductivity region, and second conductive layer 23 is a low-conductivity region. "High" and "low" in the high-conductivity region and the low-conductivity region represent relative concepts of the two regions, and merely represent relative conductivity performance of the two regions as conductive regions, but do not represent absolute conductivity performance of the conductive regions. The high-conductivity region and the low-conductivity region are relative to each other. To be specific, if there are two regions with different conductivity in one electrode, a region with higher conductivity is a high-conductivity region, and a region with lower conductivity is a low-conductivity region.

Therefore, this helps photocurrents converge from a region with lower conductivity to a region with higher conductivity, so that lateral transfer of the photocurrents in an entire region of the second electrode 20 becomes more uniform, and a sheet resistance loss caused by non-uniform lateral transfer of a large range of photocurrents is effectively avoided. This helps improve photoelectric conversion efficiency of the cell, and efficiency improvement is significant, especially for a solar cell 100 with a large area.

It should be noted that a result of comparison between the conductivity of the second conductive lattice 22 and the conductivity of the second conductive layer 23 may be obtained through measurement in a plurality of manners. For example, the sheet resistances of the second conductive layer 23 and the second conductive lattice 22 may be measured and compared to determine the result of comparison. For example, the sheet resistances of the second conductive lattice 22 and the second conductive layer 23 are compared to determine that the one with a smaller sheet resistance of the two has higher conductivity, and the one with a larger sheet resistance has lower conductivity.

Alternatively, a result of comparison between the conductivity of the second conductive lattice 22 and the conductivity of the second conductive layer 23 may be obtained by measuring and comparing resistivity of the second conductive layer 23 and resistivity of the second conductive lattice 22. For example, resistivity of the second conductive lattice 22 and resistivity of the second conductive layer 23 are compared to determine that the one with smaller resistivity of the two has higher conductivity, and the one with larger resistivity has lower conductivity.

Alternatively, a result of comparison between the conductivity of the second conductive lattice 22 and the conductivity of the second conductive layer 23 may be obtained by measuring and comparing conductance of the second conductive layer 23 and conductance of the second conductive lattice 22. For example, conductance of the second conductive lattice 22 and conductance of the second conductive layer 23 are compared to determine that the one with larger conductance of the two has higher conductivity, and the one with smaller conductance has lower conductivity.

It should be understood that the result of comparison between the conductivity of the second conductive lattice 22 and the conductivity of the second conductive layer 23 is not limited to being obtained through measurement in the foregoing listed manners. A manner in which the result of comparison between the conductivity of the second conductive lattice 22 and the conductivity of the second conductive layer 23 can be obtained through measurement shall fall within the protection scope of this application, and is not strictly limited.

With reference to FIG. 4, FIG. 9, and FIG. 10, in this embodiment of this application, the insulation layer 21 includes a second contact surface 211, and the second contact surface 211 is a surface that is on the insulation layer 21 and that is in contact with the second conductive layer 23. The second contact surface 211 is provided with a second accommodation groove 212, and the second accommodation groove 212 is configured to accommodate the second conductive lattice 22. In other words, the second conductive lattice 22 is surrounded by the insulation layer 21, and a visual effect that the insulation layer 21 wraps the second conductive lattice 22 can be presented.

It can be understood that, as shown in FIG. 9 and FIG. 10, the second accommodation groove 212 is a patterned lattice-like trench, all lattices are interconnected, and a size and a shape of the second accommodation groove 212 can be adapted to a size and a shape of the second conductive lattice 22, so as to be better in contact with the second conductive lattice 22 and improve reliability of contact with the second conductive lattice 22. A specific size and shape of the second accommodation groove 212 can be adjusted according to an actual requirement. This is not strictly limited in this embodiment of this application. For example, the second accommodation groove 212 may be honeycomb-shaped.

Therefore, the groove is provided on the insulation layer 21 to accommodate the second conductive lattice 22, so as to improve mechanical adhesion to the second conductive lattice 22, and minimize an adverse effect on the second electrode 20, with high reliability.

For example, a material of the insulation layer 21 may be a transparent colloid material that can be imprinted or etched, or a material of the insulation layer 21 may be an oxide insulation material, such as aluminum oxide. Alternatively, the material of the insulation layer 21 may be a non-oxide insulation material, such as magnesium fluoride.

With reference to FIG. 4 and FIG. 10, the second conductive lattice 22 is embedded in the second accommodation groove 212, that is, the second conductive lattice 22 is embedded in the insulation layer 21. The second conductive lattice 22 may be understood as a meshed conductive line pattern formed through cross interconnection of conductive lines.

In a possible embodiment, a pattern shape of the second conductive lattice 22 is the same as the pattern shape of the first conductive lattice 12. Therefore, processing and manufacturing can be simplified, which helps reduce a production process and improve production efficiency.

In another possible embodiment, a pattern shape of the second conductive lattice 22 is different from the pattern shape of the first conductive lattice 12.

For example, a pattern shape of a single lattice of the second conductive lattice 22 may be one of a plurality of forms, for example, may be a combination of one or more of a regular hexagon, a rectangle, a square, a rhombus, a triangle, a trapezoid, or the like, so that the second conductive lattice 22 formed through interconnection of a plurality of lattices may be in a shape of a combination of one or more of the foregoing pattern shapes. A material of the second conductive lattice 22 formed through interconnection of the plurality of lattices may include a combination of one or more of silver (Ag), copper (Cu), gold (Au), aluminum (Al), nickel (Ni), zinc (Zn), or the like. Alternatively, a material of the second conductive lattice 22 may include a combination of one or more of doped conductive polymers, metal nanowires, carbon nanotubes, graphene, or metal oxides.

In this arrangement, the second conductive lattice 22 is embedded in the insulation layer 21, and can be wrapped by the insulation layer 21, to obtain good protection performance, which facilitates protection against interference from an external environmental factor, with strong scratch resistance. In addition, because parts of the second conductive lattice 22 are cross-connected, there is no contact resistance between lines in the second conductive lattice 22. This can minimize an occurrence possibility of problems of a conductivity performance decrease and a sheet resistance increase caused due to a contact resistance between lines, and helps maintain the sheet resistance of the second electrode 20 at a relatively low level while relatively high light transmittance is maintained.

The conductivity and the light transmittance of the second conductive lattice 22 can be adjusted by adjusting a size of a single lattice, a line width between lattices, a thickness of the conductive lattice, and the like. This not only can avoid, as much as possible, occurrence of a problem that photoelectric conversion efficiency of the solar cell 100 is affected by mutual restriction between the light transmittance and the conductivity, but also can obtain a high-conductivity (for example, the sheet resistance is less than 1 Ω/sq) thin-film electrode with relatively high transmittance (for example, greater than 80%), so as to better cater preparation of the top electrode of the large-area solar cell 100.

For example, a thickness range of the second conductive lattice 22 may be a range of 0.5 μm to 15 μm (including the endpoint values). A thickness of the second conductive lattice 22 may be understood as a dimension of the second conductive lattice 22 in a direction perpendicular to the second conductive layer 23. In embodiments, the dimension is a vertical distance between a point on a body of the second conductive lattice 22 farthest from the second conductive layer 23 and the second conductive layer 23. A line width range of the second conductive lattice 22 may be a range of 0.5 μm to 10 μm (including the endpoint values).

Refer to FIG. 4. Because the second conductive lattice 22 needs to be in contact with the second conductive layer 23, at least a part (for example, a part of a surface) of the second conductive lattice 22 needs to be exposed on the insulation layer 21, so as to ensure that the second conductive lattice 22 can be in direct contact with the second conductive layer 23 for mutual conduction.

For example, a surface that is of the second conductive lattice 22 and that faces the second conductive layer 23 is coplanar with a surface that is of the insulation layer 21 and that faces the second conductive layer 23. In other words, the surface that is of the second conductive lattice 22 and that faces the second conductive layer 23 is aligned with the surface that is of the insulation layer 21 and that faces the second conductive layer 23. In this arrangement, the second conductive lattice 22 can be coplanar with the insulation layer 21 and therefore has good flatness, which helps control roughness of the solar cell 100, so as to meet a multi-scenario application requirement when the solar cell 100 is applied to the smart glasses 200.

In a possible embodiment, a thickness the second conductive lattice 22 is less than or equal to a thickness of the first conductive lattice 12. The thickness of the first conductive lattice 12 may be understood as a dimension of the first conductive lattice 12 in a direction perpendicular to the first conductive layer 13. In embodiments, the dimension is a vertical distance between a point on a body of the first conductive lattice 12 farthest from the first conductive layer 13 and the first conductive layer 13. The thickness of the second conductive lattice 22 may be understood as a dimension of the second conductive lattice 22 in a direction perpendicular to the second conductive layer 23. In embodiments, the dimension is a vertical distance between a point on a body of the second conductive lattice 22 farthest from the second conductive layer 23 and the second conductive layer 23.

It can be understood that, for the solar cell 100, the thickness of the functional layer 30 is relatively thin. The functional layer 30 is connected between the first conductive layer 13 and the second conductive layer 23, and the second conductive lattice 22 is located between the first conductive layer 13 and the second conductive layer 23. In other words, the functional layer 30 and the second conductive lattice 22 are disposed in a same layer. In this arrangement, accordingly, the thickness of the second conductive lattice 22 cannot be set as excessively large as the thickness of the first conductive lattice 12. The thickness of the second conductive lattice 22 is controlled and adjusted to adapt to the thickness of the functional layer 30, so as to fully satisfy an application requirement for an efficient large-area solar cell 100, with high reliability.

It should be noted that, in some other embodiments of this application, the thickness of the second conductive lattice 22 may alternatively be greater than the thickness of the first conductive lattice 12. This is not strictly limited.

Still refer to FIG. 4. The second conductive layer 23 covers the insulation layer 21 and is in contact with the second conductive lattice 22. In other words, the second conductive layer 23 can be in contact with the second conductive lattice 22 for conduction.

The second conductive layer 23 may be understood as a planar layer completely covering the second conductive lattice 22. The second conductive layer 23 is a layer structure, capable of being in direct contact with the functional layer 30, in the second electrode 20, and is mainly configured to collect photocurrents, such as electrons or holes, generated through light absorption by the functional layer 30, and to enable the photocurrents to be laterally transmitted in them. A material of the second conductive layer 23 may be selected based on energy level matching between the second conductive layer 23 and the functional layer 30, so as to achieve better effects of photocurrent collection and transfer.

For example, the material of the second conductive layer 23 may be a transparent conductive oxide (TCO), such as an indium tin oxide (ITO), a fluorine-doped tin oxide (FTO), an aluminum-doped zinc oxide (AZO), an antimony-doped tin oxide (ATO), a gallium-doped zinc oxide (GZO), or a boron-doped zinc oxide (BZO). Alternatively, the material of the second conductive layer 23 may be metal or an alloy. Alternatively, the material of the second conductive layer 23 may be a thin-layer composite of metal or an alloy and a TCO. Alternatively, the material of the second conductive layer 23 may be a thin-layer composite of metal or an alloy and a metal oxide, such as a molybdenum oxide, a zinc oxide, or a tungsten oxide. Alternatively, the material of the second conductive layer 23 may be a composite of an organic matter and an ITO, such as copper phthalocyanine (CuPc)/ITO, zinc phthalocyanine (ZnPc)/ITO, CuPc/lithium (Li)/ITO, or bathocuproine (BCP)/Li/ITO. Alternatively, the material of the second conductive layer 23 may be a combination of one or more of a conductive polymer (PEDOT:PSS), a carbon nanotube (CNT), graphene, or the like.

In this embodiment of this application, the conductivity of the second conductive lattice 22 is higher than the conductivity of the second conductive layer 23. Therefore, when a photocurrent collected by the second conductive layer 23 is laterally transmitted in the second conductive layer 23, the photocurrent is collected by the nearby second conductive lattice 22 and finally output to the outside for power supply.

Based on the foregoing description, it should be understood that both the second conductive layer 23 and the second conductive lattice 22 are electrical conductors capable of allowing a current to pass. Therefore, the second conductive lattice 22 is disposed, and the second conductive lattice 22 is in contact with the second conductive layer 23, so that the second conductive lattice 22 can be used as a main conductive structure, the second conductive layer 23 can be used as an auxiliary conductive structure, and they cooperate with each other to form a conductive part in the second electrode 20. In other words, the second conductive layer 23 and the second conductive lattice 22 cooperate with each other to form a combination electrode.

In this arrangement, the conductivity of the second conductive lattice 22 is higher than the conductivity of the second conductive layer 23. Therefore, the second conductive lattice 22 is introduced, so that after being collected by the second conductive layer 23, a photocurrent can be laterally transferred to the nearby second conductive lattice 22, and output through the second conductive lattice 22 to the outside for power supply. A distance required for lateral transfer of the photocurrent in the second conductive layer 23 can be greatly reduced, thereby reducing a loss in the second conductive layer 23, and minimizing an occurrence possibility of a problem that efficiency of the solar cell 100 is severely affected by a relatively large sheet resistance of the second conductive layer 23. In addition, compared with single-form electrode construction by using a conductive layer, in the second electrode 20 including a combination of the second conductive layer 23 and the second conductive lattice 22, an overall sheet resistance of the second electrode 20 can be greatly reduced due to high conductivity and high light transmittance of the second conductive lattice 22. Further, this minimizes an occurrence possibility of problems of a significant increase of a cell equivalent series resistance and a large decrease in a fill factor and a short-circuit current caused by a relatively large sheet resistance as a device effective area of the solar cell 100 is enlarged, significantly mitigates impact of a sheet resistance on cell efficiency after cell size enlargement, and improves photoelectric conversion efficiency of the solar cell 100, thereby better adapting to a development trend of application of large-area solar cells 100.

Based on the foregoing description, it should be understood that because the first electrode 10 and the second electrode 20 each are a combination electrode of "conductive layer+conductive lattice", and the combination electrode can greatly reduce a sheet resistance of the corresponding electrode, a sum of sheet resistances of two electrodes can be controlled within several w/sq or less (which is, for example, less than or equal to 3 w/sq) when compared with an existing technology in which single-form electrode construction is used for two electrodes to form a relatively large sum of sheet resistances, which is tens of Ω/sq or even reaches a hundred of Ω/sq. Therefore, the sum of the sheet resistances of the two electrodes in the existing technology can be reduced by 1 to 2 orders of magnitude, the sum of the sheet resistances of the two electrodes can be greatly reduced, impact of the sheet resistance on cell efficiency after cell size enlargement is significantly mitigated, and photoelectric conversion efficiency is improved, thereby adapting to a development trend of large-area cell preparation.

Refer to FIG. 4. For example, the insulation layer 21 has a same shape as the second conductive lattice 22. To be specific, the insulation layer 21 can be in a lattice-like shape matching the second conductive lattice 22. In other words, the insulation layer 21 does not completely cover the first conductive layer 13, but covers only a part of the first conductive layer 13.

Figure 12:
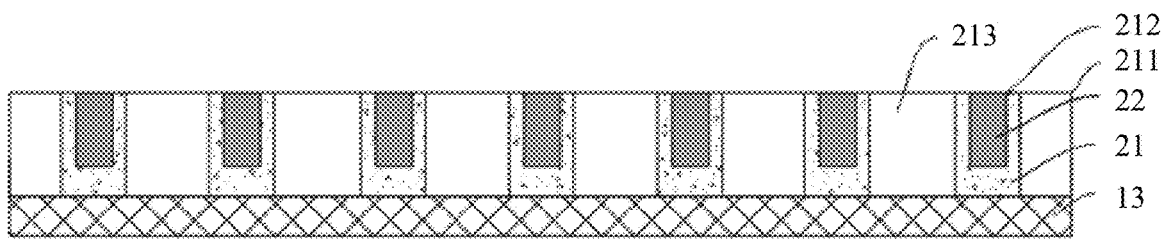
FIG. 12 is a schematic diagram of a structure of a part of a second electrode of a solar cell according to an embodiment of this application.

In embodiments, as shown in FIG. 12, the insulation layer 21 has a plurality of through-holes 213 penetrating the insulation layer 21, and the plurality of through-holes 213 are spaced apart and are independent of each other, so that the insulation layer 21 is in a meshed shape with a plurality of hollow lattices. On the basis that the insulation layer 21 is fully adapted to the shape of the second conductive lattice 22, a size of space occupied by the insulation layer 21 can be reduced, so as to avoid waste of space of a device structure of the solar cell 100, and implement device miniaturization of the solar cell 100. In addition, the lattice-like insulation layer 21 can free up particular space to accommodate the functional layer 30, which helps maximize space utilization in a limited spatial layout.

The insulation layer 21 has a plurality of through-holes 213 arranged to be spaced apart, and further, the insulation layer 21 is connected between the first conductive layer 13 and the second conductive layer 23. Therefore, a spacing region C can be formed between the first conductive layer 13 and the second conductive layer 23. The spacing region C may be understood as space jointly occupied by a plurality of through-holes 213. The functional layer 30 is located in the spacing region C and is connected between the first conductive layer 13 and the second conductive layer 23.

In this arrangement, the functional layer 30 can be arranged in a same layer as the insulation layer 21 that wraps the second conductive lattice 22. On the basis that the functional layer 30 is in contact with both the first conductive layer 13 and the second conductive layer 23, an overall thickness of the solar cell 100 can be reduced, which helps achieve a development trend of miniaturization and thinness of the solar cell 100. In addition, direct contact with the second conductive lattice 22 can be avoided through isolation by using the insulation layer 21, so as to minimize an occurrence possibility of problems caused by direct contact between the functional layer 30 and the second conductive lattice 22, such as direct recombination of carriers, existence of a leakage current, a decrease in cell performance, and possible erosion of the functional layer 30 by the electrodes. Therefore, a transfer path of "the functional layer 30—the second conductive layer 23—the second conductive lattice 22" of a photocurrent can be smoothly achieved, and interference between the parts can be avoided.

It should be noted that, in this embodiment of this application, a shape of the through-hole 213 is not limited, and the shape of the through-hole 213 may cooperate with a shape of a single lattice of the second conductive lattice 22 to present a diversified representation form. For example, the shape of the through-hole 213 may be a regular hexagon, a rectangle, a square, a rhombus, a triangle, or a trapezoid. For example, the shape of a single lattice of the second conductive lattice 22 is a regular hexagon, and the through-hole 213 is also in a shape of a regular hexagon.

With reference to FIG. 4, FIG. 13, FIG. 14, and FIG. 15, the functional layer 30 includes a first transport layer 31, a light absorption layer 32, and a second transport layer 33 that are sequentially disposed in a laminated manner. The first transport layer 31 is in contact with the first conductive layer 13, and the second transport layer 33 is in contact with the second conductive layer 23. In other words, the first transport layer 31, the light absorption layer 32, and the second transport layer 33 are sequentially disposed in a laminated manner in a direction from the first conductive layer 13 to the second conductive layer 23.

In this embodiment of this application, the functional layer 30 can generate electron-hole pairs. In embodiments, one of the first transport layer 31 and the second transport layer 33 is configured to transport electrons, and the other is configured to transport holes. To be specific, when the first transport layer 31 transports electrons, the second transport layer 33 transports holes; when the first transport layer 31 transports holes, the second transport layer 33 transports electrons.

In addition, the solar cell 100 can be an organic solar cell, a perovskite solar cell, a quantum dot solar cell, or the like depending on a material of the light absorption layer 32 of the solar cell 100. For example, when the solar cell 100 is an organic solar cell, the material of the light absorption layer 32 of the solar cell 100 includes a bicomponent or multi-component blend material of at least one electron donor material and at least one electron acceptor material. The electron donor material may be polymeric PTB7-Th, PBDB-T, PM6, D18, or a derivative thereof, or the like, and the electron acceptor material may be PCBM, ITIC, Y6, or a derivative thereof, or the like. When the solar cell 100 is a perovskite solar cell, the material of the light absorption layer 32 of the solar cell 100 may include methylamine lead iodine, methyl ether lead iodine, cesium lead iodine, and three-dimensional or two-dimensional perovskite with a plurality of composite cations and composite anions, and the like. When the solar cell 100 is a quantum dot solar cell, the material of the light absorption layer 32 of the solar cell 100 may include perovskite quantum dots, lead sulfur (selenide), cadmium sulfide, indium phosphide, and the like.

It can be understood that solar cells 100 can be classified into a conventional structure and an inverted structure according to capabilities of extracting electrons or holes in a cell by a first transport layer 31 and a second transport layer 33 of a solar cell 100. For example, in a conventional structure of a perovskite solar cell, the first transport layer 31 is an electron transport layer, and the second transport layer 33 is a hole transport layer. In an inverted structure of a perovskite solar cell, the first transport layer 31 is a hole transport layer, and the second transport layer 33 is an electron transport layer.

It should be noted that different materials of the light absorption layer 32 merely correspond to different types of solar cells 100, and which one of the two transport layers transports electrons or transports holes also merely corresponds to one of the two conventional and inverted device structures of solar cells 100. In this embodiment of this application, selection of the material of the light absorption layer 32, and specific objects (holes and electrons) that the two transport layers are responsible for transporting are not strictly limited.

Based on the foregoing description, it should be understood that a working process of the functional layer 30 may be briefly summarized as follows: Under illumination, the light absorption layer 32 absorbs radiated photon energy to generate photo-generated excitons (electron-hole pairs), and the photo-generated excitons are decomposed to generate free carriers (electrons and holes). The electrons and holes respectively diffuse to a transport layer for collecting electrons and a transport layer for collecting holes, and are collected, and finally, a current is formed in an external circuit.

It can be understood that, because the functional layer 30 is correspondingly filled in the through-holes 213 of the insulation layer 21, a thickness of the functional layer 30 needs to be set in consideration of a depth of the through-hole 213. The depth of the through-hole 213 may be understood as a dimension perpendicular to a direction of the second conductive layer 23, and may also be understood as a thickness of the insulation layer 21. Moreover, considering that a thickness of an active layer of the solar cell 100 may be relatively light and thin, a thickness of the entire functional layer 30 needs to be controlled at a relatively low level. Therefore, in this embodiment of this application, the first conductive layer 13 and/or the second conductive layer 23 may also be disposed in the spacing region C, so that the functional layer 30, the first conductive layer 13, and/or the second conductive layer 23 cooperate with each other to jointly match the thickness of the insulation layer 21. Therefore, the thickness of the functional layer 30 can be maintained at a relatively good level, and the spacing region C in the insulation layer 21 is jointly filled, which helps improve device stability and reliability of the solar cell 100.

Figure 13:
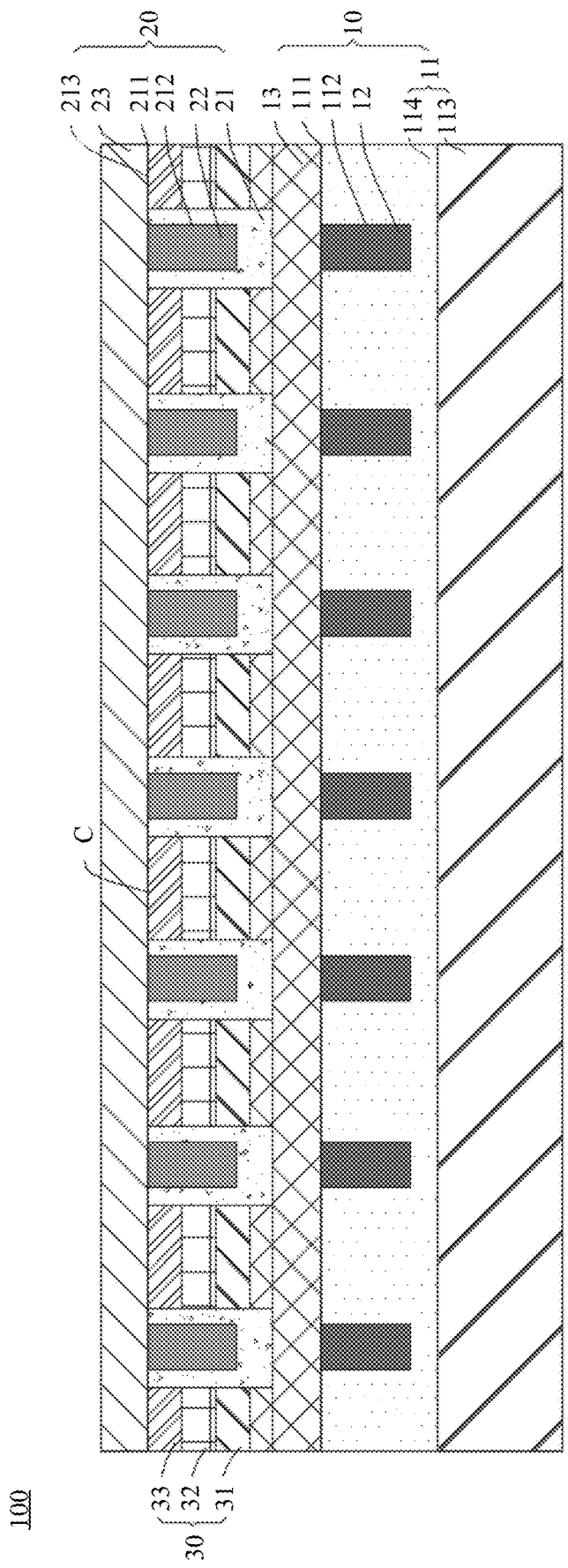
FIG. 13 is a schematic diagram of still another structure of a solar cell according to an embodiment of this application.

In a possible embodiment, as shown in FIG. 13, at least a part of the first conductive layer 13 is located in the spacing region C. To be specific, the first conductive layer 13 covers the first conductive lattice 12, and further, on a side that is of the first conductive layer 13 and that is away from the first conductive lattice 12, a part corresponding to a position of the through-hole 213 of the insulation layer 21 protrudes toward the direction of the second conductive layer 23, so as to extend into the through-hole 213 of the insulation layer 21.

In this arrangement, the functional layer 30 and the first conductive layer 13 can cooperate with each other to jointly match the thickness of the insulation layer 21. On the basis that the thickness of the functional layer 30 is maintained at a relatively good level, the functional layer 30 and the first conductive layer 13 can jointly fill the spacing region C in the insulation layer 21, which helps improve device stability and reliability of the solar cell 100. In addition, properly increasing a thickness of the first conductive layer 13 can further reduce the sheet resistance of the first electrode 10, which helps mitigate impact of the sheet resistance on cell efficiency after cell size enlargement, thereby achieving efficient preparation of large-area solar cells 100.

Figure 14:
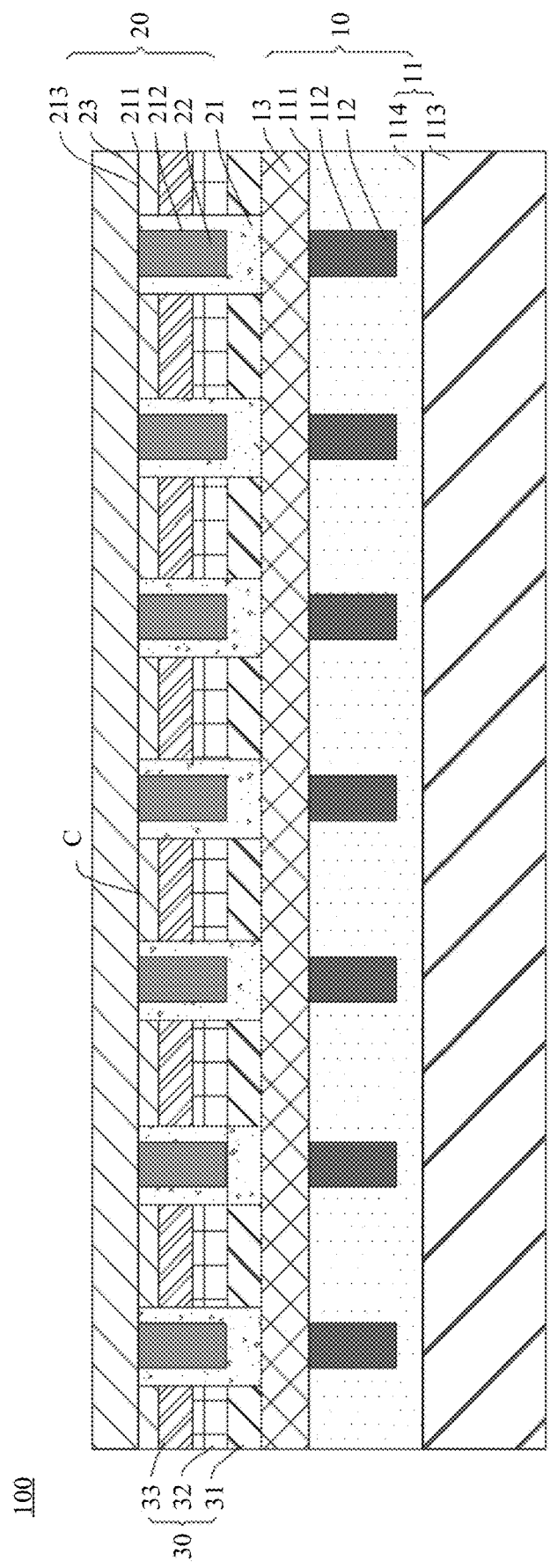
FIG. 14 is a schematic diagram of yet another structure of a solar cell according to an embodiment of this application.

In another possible embodiment, as shown in FIG. 14, at least a part of the second conductive layer 23 is located in the spacing region C. To be specific, the second conductive layer 23 covers the second conductive lattice 22, and further, on a side that is of the second conductive layer 23 and that faces the first conductive lattice 12, a part corresponding to a position of the through-hole 213 of the insulation layer 21 protrudes toward the direction of the first conductive layer 13, so as to extend into the through-hole 213 of the insulation layer 21.

In this arrangement, the functional layer 30 and the second conductive layer 23 can cooperate with each other to jointly match the thickness of the insulation layer 21. On the basis that the thickness of the functional layer 30 is maintained at a relatively good level, the functional layer 30 and the second conductive layer 23 can jointly fill the spacing region C in the insulation layer 21, which helps improve device stability and reliability of the solar cell 100. In addition, properly increasing a thickness of the second conductive layer 23 can also further reduce the sheet resistance of the second electrode 20, which helps reduce a series resistance, and improve the fill factor and current density, so as to effectively improve energy conversion efficiency.

Figure 15:
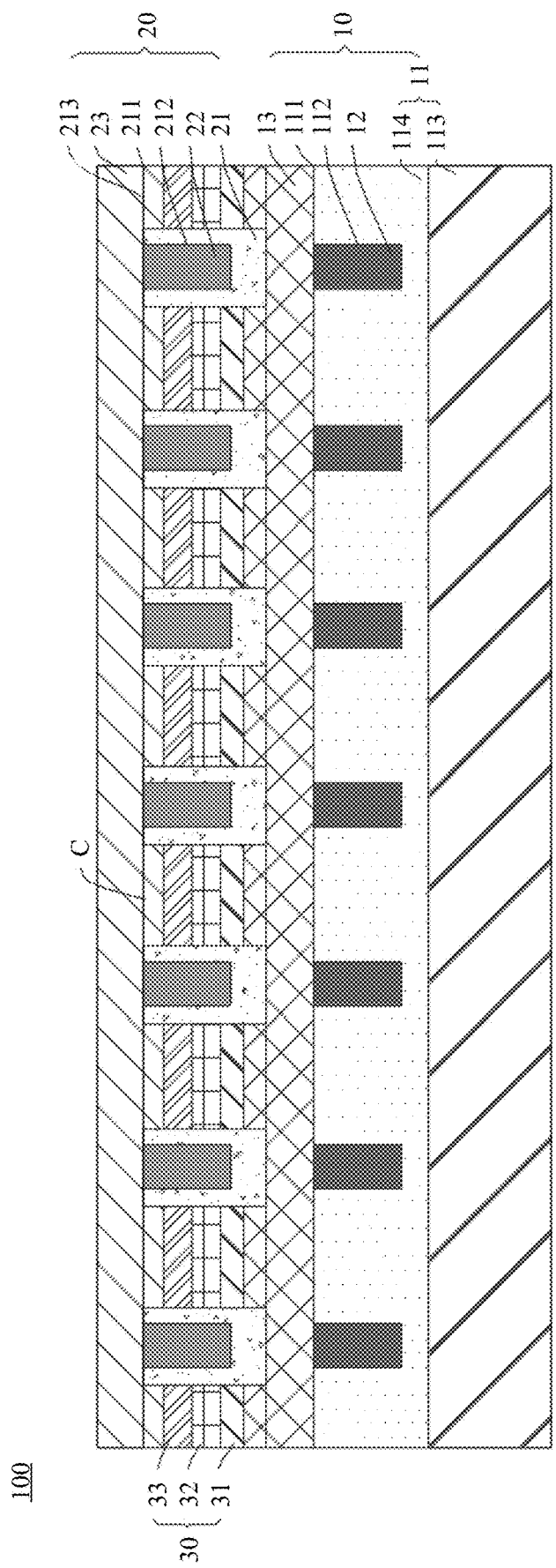
FIG. 15 is a schematic diagram of a fifth structure of a solar cell according to an embodiment of this application.

In still another possible embodiment, as shown in FIG. 15, both at least a part of the first conductive layer 13 and at least a part of the second conductive layer 23 are located in the spacing region C. To be specific, the first conductive layer 13 covers the first conductive lattice 12, and further, on a side that is of the first conductive layer 13 and that is away from the first conductive lattice 12, a part corresponding to a position of the through-hole 213 of the insulation layer 21 protrudes toward the direction of the second conductive layer 23, so as to extend into the through-hole 213 of the insulation layer 21. The second conductive layer 23 covers the second conductive lattice 22, and further, on a side that is of the second conductive layer 23 and that faces the first conductive lattice 12, a part corresponding to a position of the through-hole 213 of the insulation layer 21 protrudes toward the direction of the first conductive layer 13, so as to extend into the through-hole 213 of the insulation layer 21.

In this arrangement, the functional layer 30, the first conductive layer 13, and the second conductive layer 23 can cooperate with each other to jointly match the thickness of the insulation layer 21. On the basis that the thickness of the functional layer 30 is maintained at a relatively good level, the functional layer 30, the first conductive layer 13, and the second conductive layer 23 can jointly fill the spacing region C in the insulation layer 21, which helps improve device stability and reliability of the solar cell 100. In addition, properly increasing a thickness of the first conductive layer 13 and a thickness of the second conductive layer 23 can further reduce the sheet resistances of the first electrode 10 and the second electrode 20, which helps mitigate impact of the sheet resistance on cell efficiency after cell size enlargement, thereby improving photoelectric conversion efficiency, and adapting to a development trend of large-area cell preparation.

An embodiment of this application further provides a method for preparing a solar cell 100. For omitted content of a structure of the solar cell 100 in the preparation method, refer to FIG. 1 to FIG. 15 and the foregoing descriptions. Details are not described herein again. In addition, the solar cell 100 shown in FIG. 1 to FIG. 15 is still used as an example in the following for further description. In a case of no conflict, the descriptions may be all applied to the solar cell 100 shown in FIG. 1 to FIG. 15.

Figure 16:
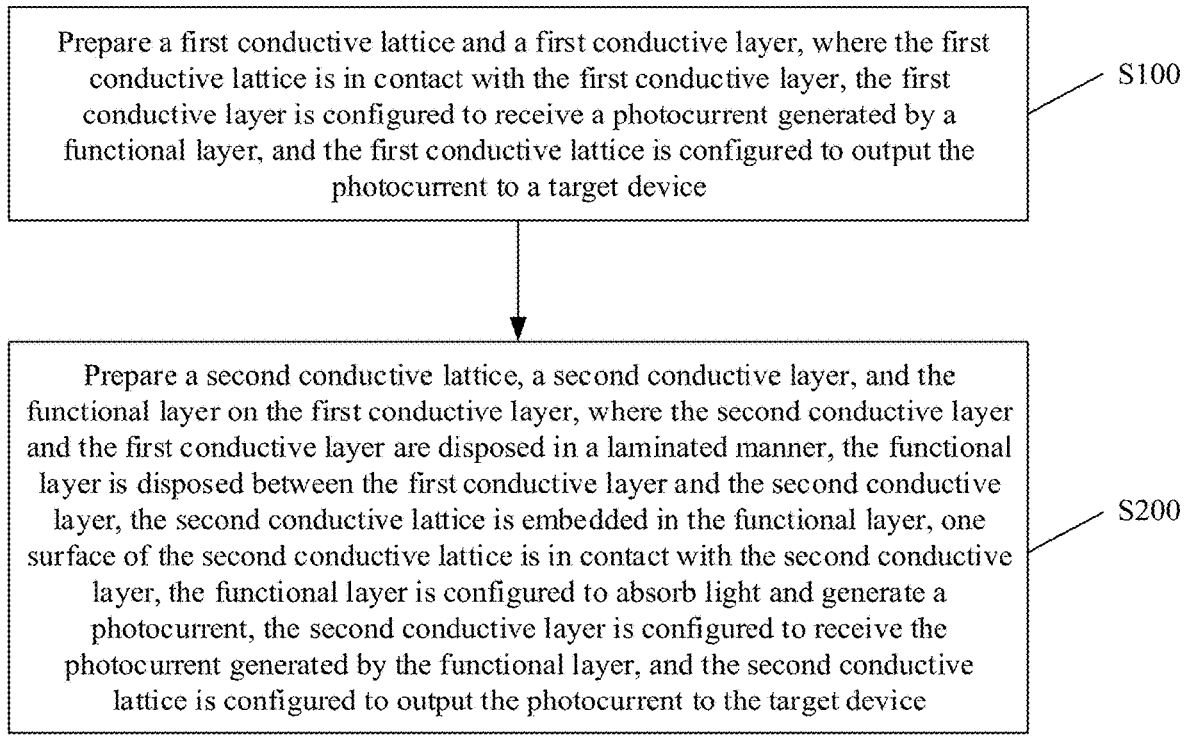
FIG. 16 is a schematic flowchart of a method for preparing a solar cell according to an embodiment of this application.

With reference to FIG. 4 and FIG. 16, the method for preparing a solar cell 100 may include at least operations S100 and S200, which are described in detail as follows:

S100. Prepare a first conductive lattice 12 and a first conductive layer 13, where the first conductive lattice 12 is in contact with the first conductive layer 13, the first conductive layer 13 is configured to receive a photocurrent generated by a functional layer 30, and the first conductive lattice 12 is configured to output the photocurrent to a target device.

S200. Prepare a second conductive lattice 22, a second conductive layer 23, and the functional layer 30 on the first conductive layer 13, where the second conductive layer 23 and the first conductive layer 13 are disposed in a laminated manner, the functional layer 30 is disposed between the first conductive layer 13 and the second conductive layer 23, the second conductive lattice 22 is embedded in the functional layer 30, one surface of the second conductive lattice 22 is in contact with the second conductive layer 23, the functional layer 30 is configured to absorb light and generate a photocurrent, the second conductive layer 23 is configured to receive the photocurrent generated by the functional layer 30, and the second conductive lattice 22 is configured to output the photocurrent to the target device.

The operations are further described below.

The foregoing operation S100 is described below with reference to FIG. 16, FIG. 17, FIG. 18, and FIG. 19.

S100. Prepare a first conductive lattice 12 and a first conductive layer 13, where the first conductive lattice 12 is in contact with the first conductive layer 13, the first conductive layer 13 is configured to receive a photocurrent generated by a functional layer 30, and the first conductive lattice 12 is configured to output the photocurrent to a target device.

Figure 17:
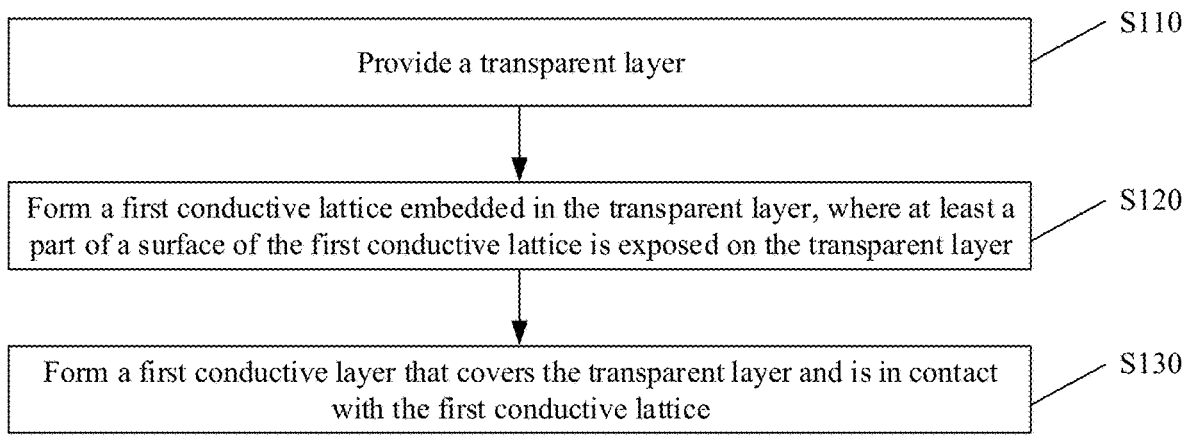
FIG. 17 is a schematic flowchart of operation S100 of the method for preparing a solar cell shown in FIG. 16.
Figure 18:
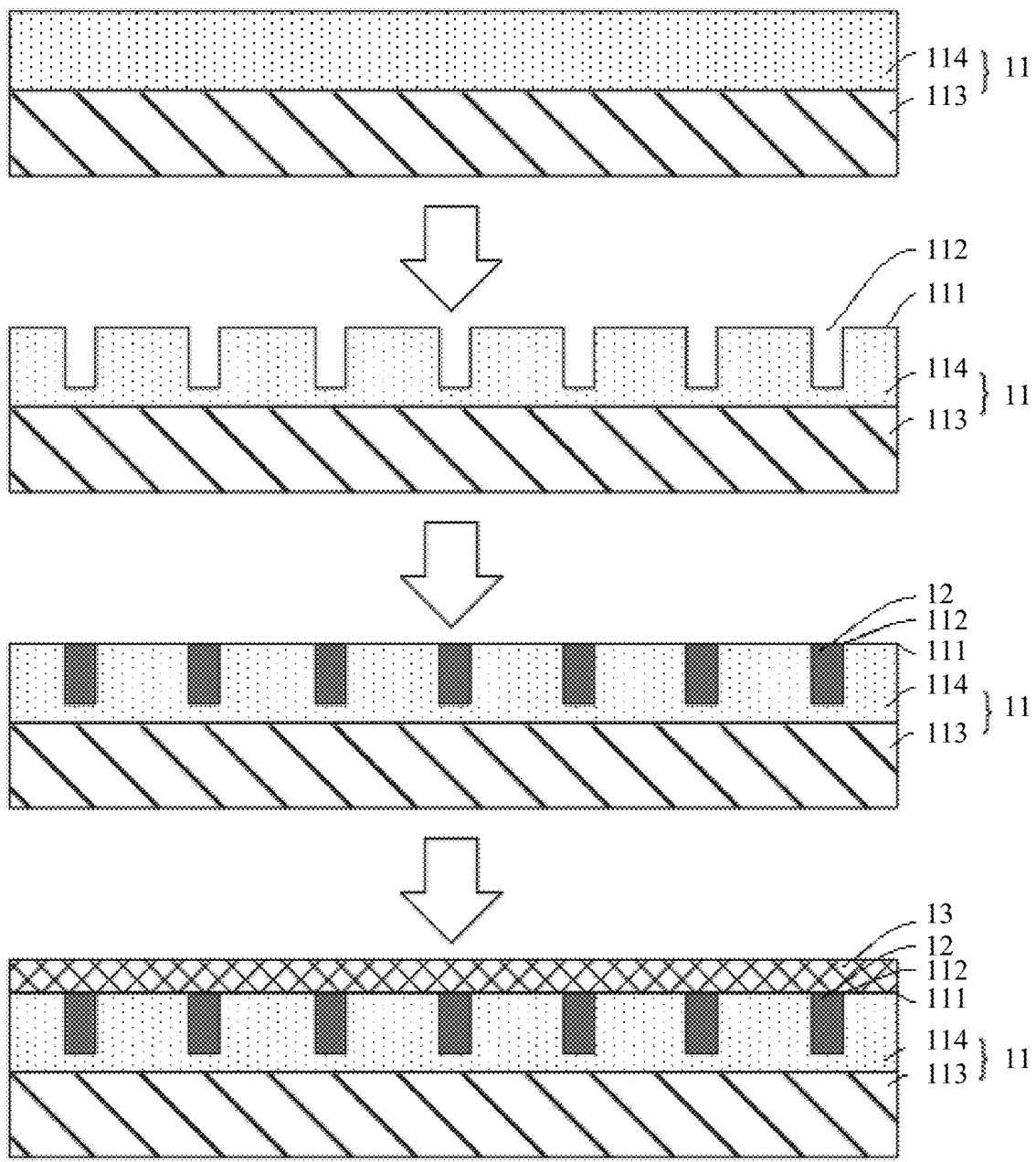
FIG. 18 is a schematic operation flowchart of operation S100 of the method for preparing a solar cell shown in FIG. 17.

In embodiments, as shown in FIG. 17 and FIG. 18, operation S100 may include at least operations S110, S120, and S130. Details are as follows.

S110. Provide a transparent layer 11.

The transparent layer 11 may include a single-layer structure, or may include a multi-layer structure.

When the transparent layer 11 includes a single-layer structure, a material of the transparent layer 11 may be a colloid material formed after liquid curing, such as a thermoplastic high-molecular polymer, a photocurable polymer, or a thermocurable polymer. For example, the material of the transparent layer 11 may be polymethyl methacrylate (PMMA).

Figure 19:
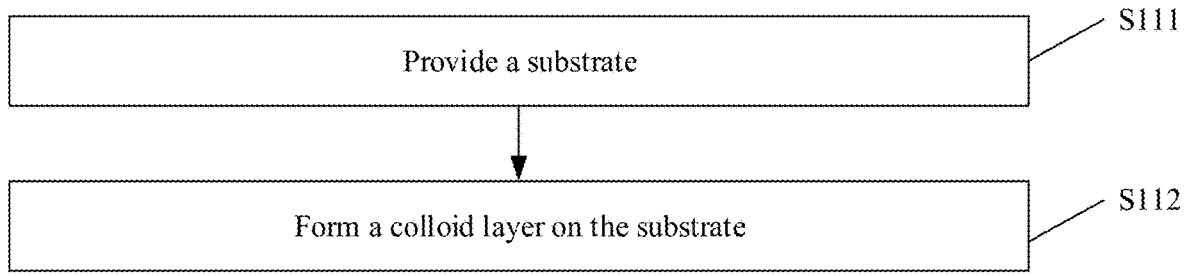
FIG. 19 is a schematic flowchart of operation S110 of the method for preparing a solar cell shown in FIG. 17.

When the transparent layer 11 includes a multi-layer structure, as shown in FIG. 18 and FIG. 19, operation S110 may include at least operations S111 and S112. Details are as follows.

S111. Provide a substrate 113.

The substrate 113 may be a transparent substrate 113 having high transmittance, such as polyethylene terephthalate (PET).

S112. Form a colloidal layer 114 on the substrate 113.

The colloidal layer 114 may be formed on the substrate 113 through coating such as spin coating or scrape coating.

A material of the colloidal layer 114 may be a colloid material formed after liquid curing, such as a thermoplastic high-molecular polymer, a photocurable polymer, or a thermocurable polymer.

For example, the material of the transparent layer 11 may be polymethyl methacrylate (PMMA).

S120. Form the first conductive lattice 12 embedded in the transparent layer 11, where at least a part of a surface of the first conductive lattice 12 is exposed on the transparent layer 11.

With reference to FIG. 17 and FIG. 18, first, a first accommodation groove 112 may be formed on the transparent layer 11 by using imprinting, where the first accommodation groove 112 is a patterned trench.

It can be understood that, the first accommodation groove 112 may be a patterned lattice-like trench, and all lattices are interconnected. For example, a shape of a single lattice in the first accommodation groove 112 may be in a shape of a regular hexagon, and a single edge length, line width, and depth of the single lattice may vary depending on specific application of the solar cell 100 (such as a perovskite solar cell, an organic solar cell, or a quantum dot solar cell), and may be adjusted based on an actual application scenario. This is not strictly limited.

Next, the first conductive lattice 12 filled in the first accommodation groove 112 is formed in the first accommodation groove 112. Therefore, the first conductive lattice 12 can be in a shape of being embedded in the transparent layer 11.

The first conductive lattice 12 may be obtained by filling the first accommodation groove 112 with a conductive material and polishing and flattening the conductive material. For example, the first accommodation groove 112 may be filled with silver (Ag) and then coated with copper (Cu), and after polishing and flattening, the first conductive lattice 12 made of an Ag/Cu composite is prepared. A specific thickness of filled silver and coated copper in the first accommodation groove 112 may vary depending on specific application of the solar cell 100 (such as a perovskite solar cell, an organic solar cell, or a quantum dot solar cell), and may be adjusted based on an actual application scenario. This is not strictly limited.

S130. Form the first conductive layer 13 that covers the transparent layer 11 and is in contact with the first conductive lattice 12.

The first conductive layer 13 may be prepared through low-temperature magnetron sputtering. For example, a material of the first conductive layer 13 may be an ITO, so that the first conductive layer 13 and the first conductive lattice 12 made of an Ag/Cu composite can jointly form a first electrode 10 made of an ITO/Ag/Cu composite. A thickness of the first conductive layer 13 may vary depending on specific application of the solar cell 100 (such as a perovskite solar cell, an organic solar cell, or a quantum dot solar cell), and may be adjusted based on an actual application scenario. This is not strictly limited.

The foregoing operation S200 is described below with reference to FIG. 4, FIG. 20, FIG. 21, and FIG. 22.

S200. Prepare a second conductive lattice 22, a second conductive layer 23, and a functional layer 30 on a first conductive layer 13, where the second conductive layer 23 and the first conductive layer 13 are disposed in a laminated manner, the functional layer 30 is disposed between the first conductive layer 13 and the second conductive layer 23, the second conductive lattice 22 is embedded in the functional layer 30, one surface of the second conductive lattice 22 is in contact with the second conductive layer 23, the functional layer 30 is configured to absorb light and generate a photocurrent, the second conductive layer 23 is configured to receive the photocurrent generated by the functional layer 30, and the second conductive lattice 22 is configured to output the photocurrent to the target device.

Figure 20:
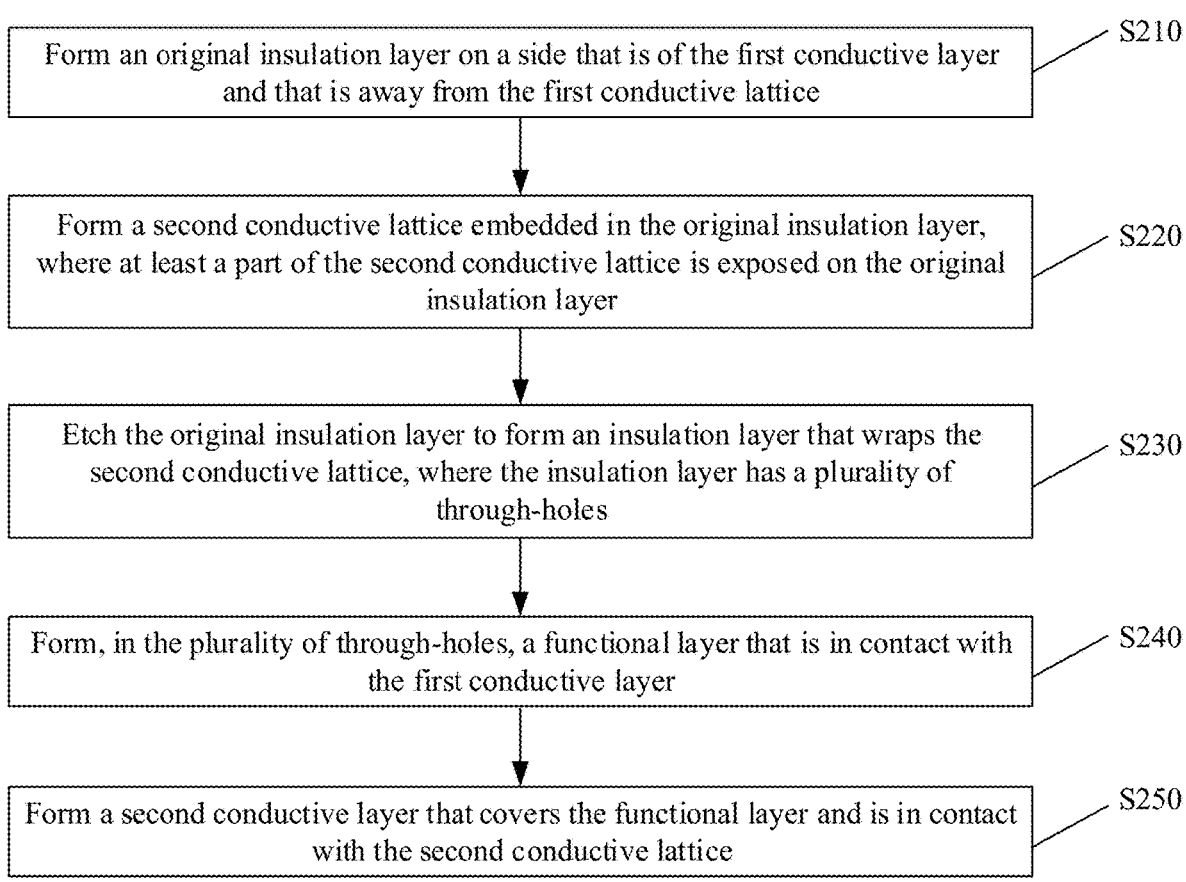
FIG. 20 is a schematic flowchart of operation S200 of the method for preparing a solar cell shown in FIG. 16.
Figure 21:
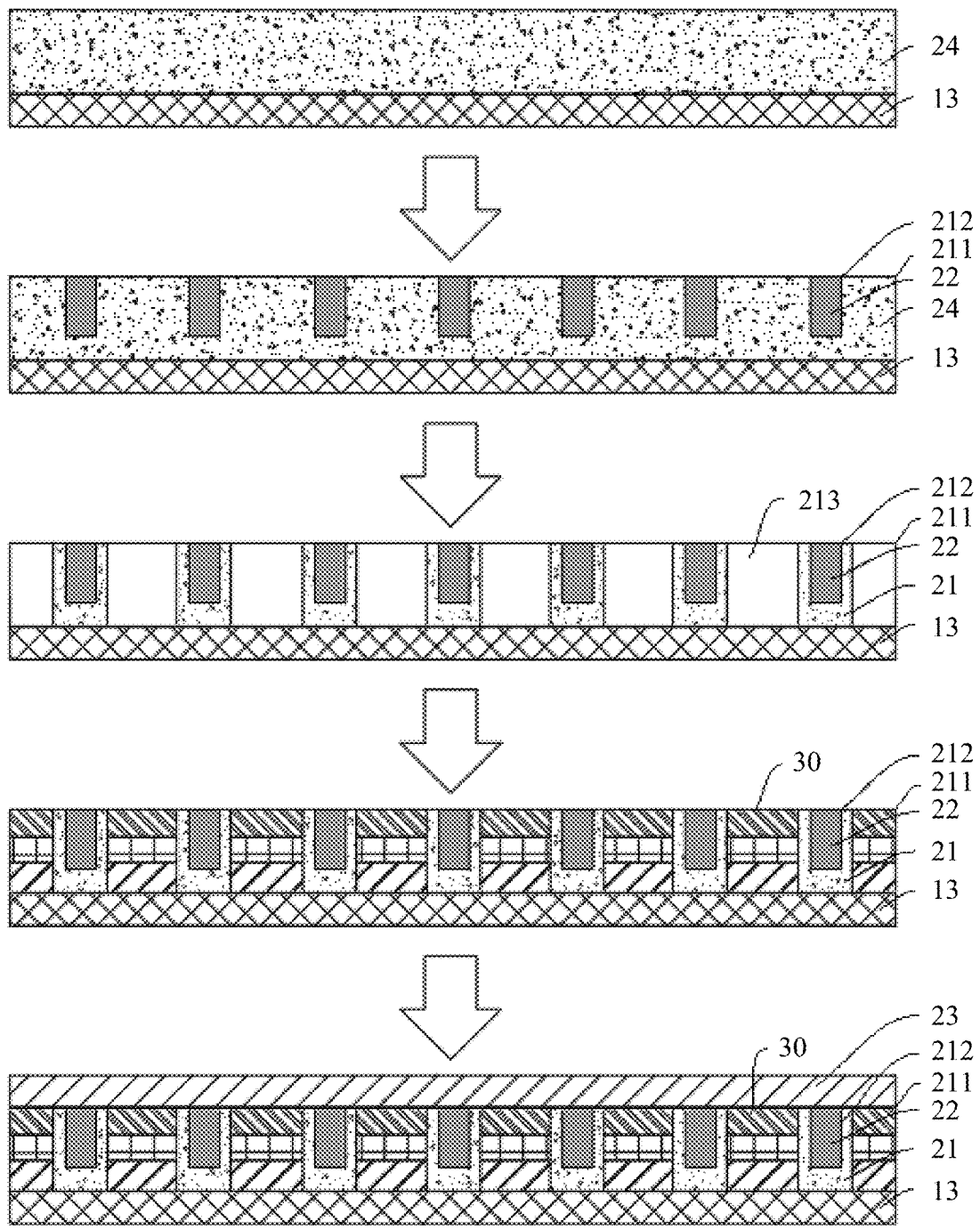
FIG. 21 is a schematic operation flowchart of operation S200 of the method for preparing a solar cell shown in FIG. 20.

In embodiments, as shown in FIG. 20 and FIG. 21, operation S200 may include at least operations S210, S220, S230, S240, and S250. Details are as follows.

S210. Form an original insulation layer 24 on a side that is of the first conductive layer 13 and that is away from the first conductive lattice 12.

The original insulation layer 24 may be formed on the first conductive layer 13 through spin coating, scrape coating, or the like. For example, a material of the original insulation layer 24 may be a transparent colloid material that can be imprinted or etched, or a material of the original insulation layer 24 may be an oxide insulation material, such as aluminum oxide. Alternatively, the material of the original insulation layer 24 may be a non-oxide insulation material, such as magnesium fluoride. A thickness of the original insulation layer 24 may vary depending on specific application of the solar cell 100 (such as a perovskite solar cell, an organic solar cell, or a quantum dot solar cell), and may be adjusted based on an actual application scenario. This is not strictly limited.

S220. Form the second conductive lattice 22 embedded in the original insulation layer 24, where at least a part of the second conductive lattice 22 is exposed on the original insulation layer 24.

Figure 22:
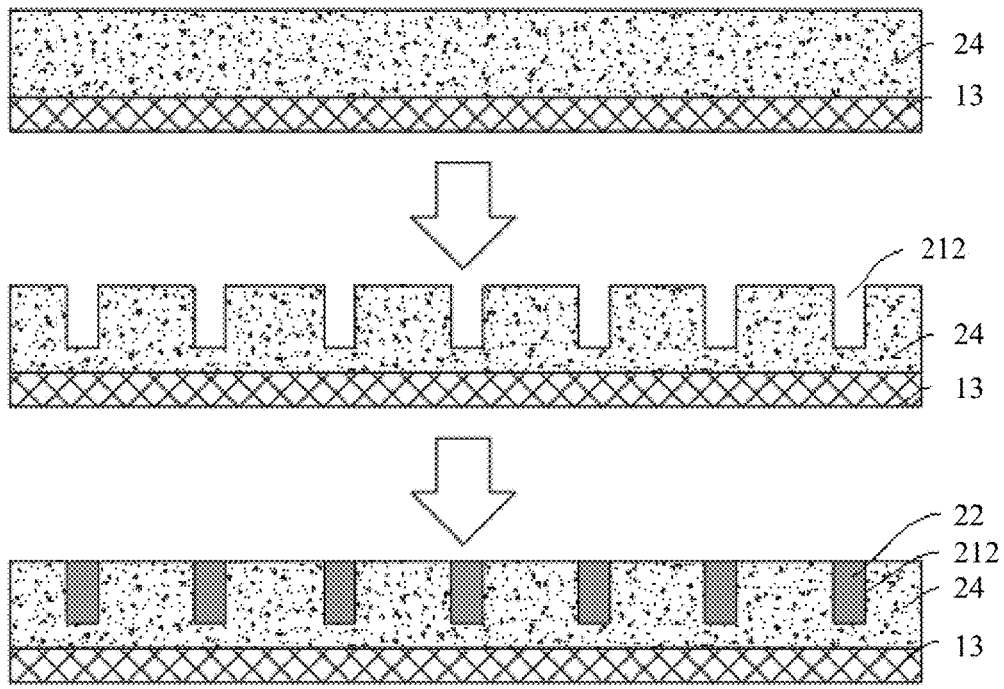
FIG. 22 is a partially detailed schematic diagram of the method for preparing a solar cell shown in FIG. 21.

With reference to FIG. 21 and FIG. 22, first, a second accommodation groove 212 may be formed on a transparent layer 11 by using imprinting or the like, where the second accommodation groove 212 is a patterned trench.

It can be understood that, the second accommodation groove 212 may be a patterned lattice-like trench, and all lattices are interconnected. For example, a shape of a single lattice in the second accommodation groove 212 may be in a shape of a regular hexagon, and a single edge length, line width, and depth of the single lattice may vary depending on specific application of the solar cell 100 (such as a perovskite solar cell, an organic solar cell, or a quantum dot solar cell), and may be adjusted based on an actual application scenario. This is not strictly limited.

Next, the second conductive lattice 22 filled in the second accommodation groove 212 is formed in the second accommodation groove 212. Therefore, the second conductive lattice 22 can be in a shape of being embedded in the transparent layer 11.

The second conductive lattice 22 may be obtained by filling the second accommodation groove 212 with a conductive material and polishing and flattening the conductive material. For example, the second accommodation groove 212 may be filled with silver (Ag), and after polishing and flattening, the second conductive lattice 22 made of simple Ag is prepared. A specific thickness of filled silver in the second accommodation groove 212 may vary depending on specific application of the solar cell 100 (such as a perovskite solar cell, an organic solar cell, or a quantum dot solar cell), and may be adjusted based on an actual application scenario. This is not strictly limited.

S230. Etch the original insulation layer 24 to form an insulation layer 21 that wraps the second conductive lattice 22, where the insulation layer 21 has a plurality of through-holes 213.

Figure 23:
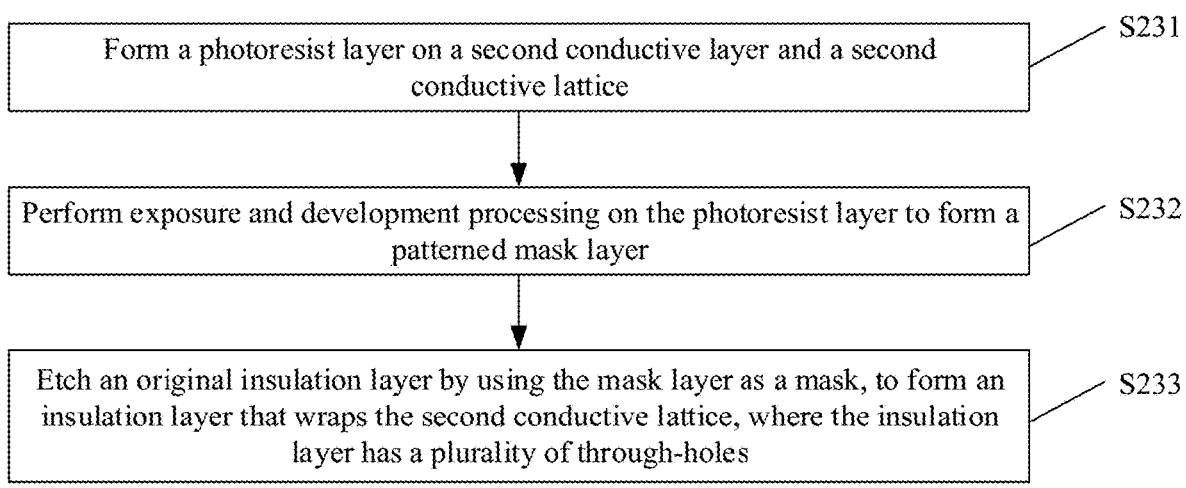
FIG. 23 is a schematic flowchart of operation S230 of the method for preparing a solar cell shown in FIG. 20.
Figure 24:
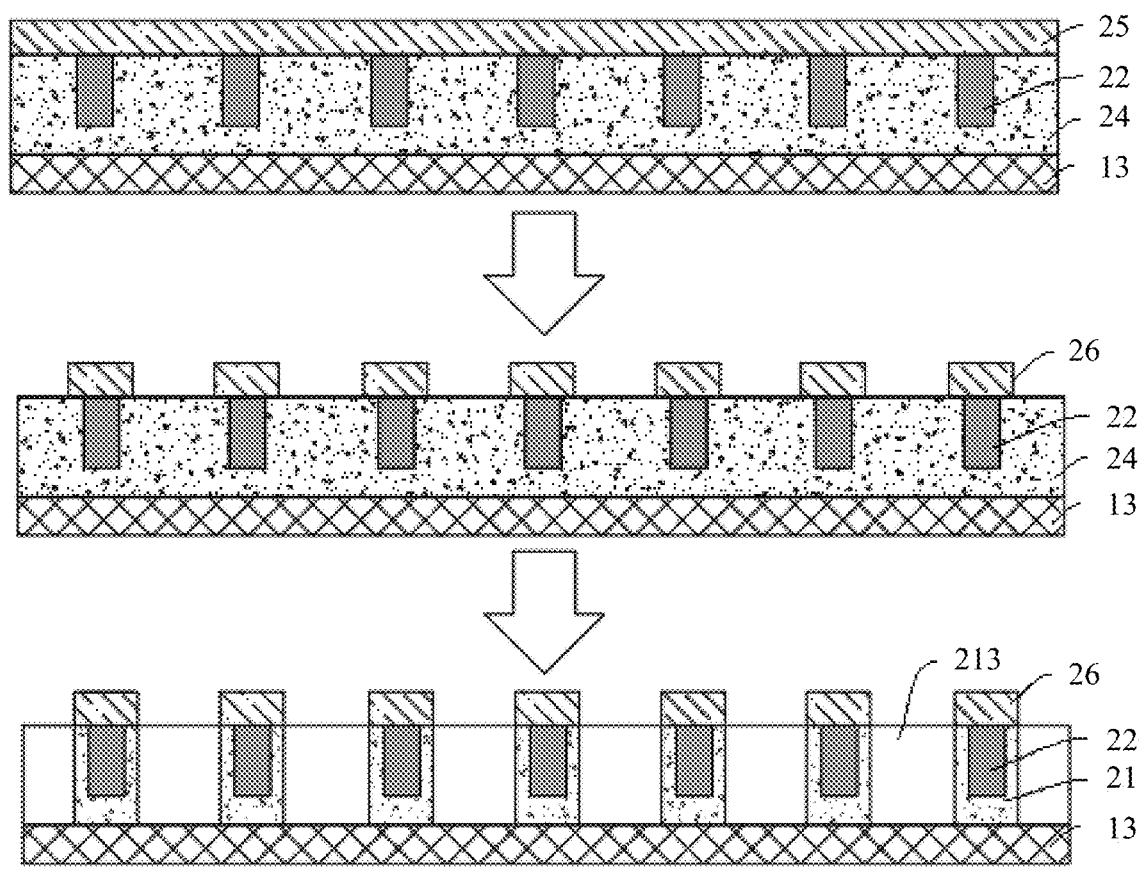
FIG. 24 is a schematic operation flowchart of operation S230 of the method for preparing a solar cell shown in FIG. 20.
Figure 25:
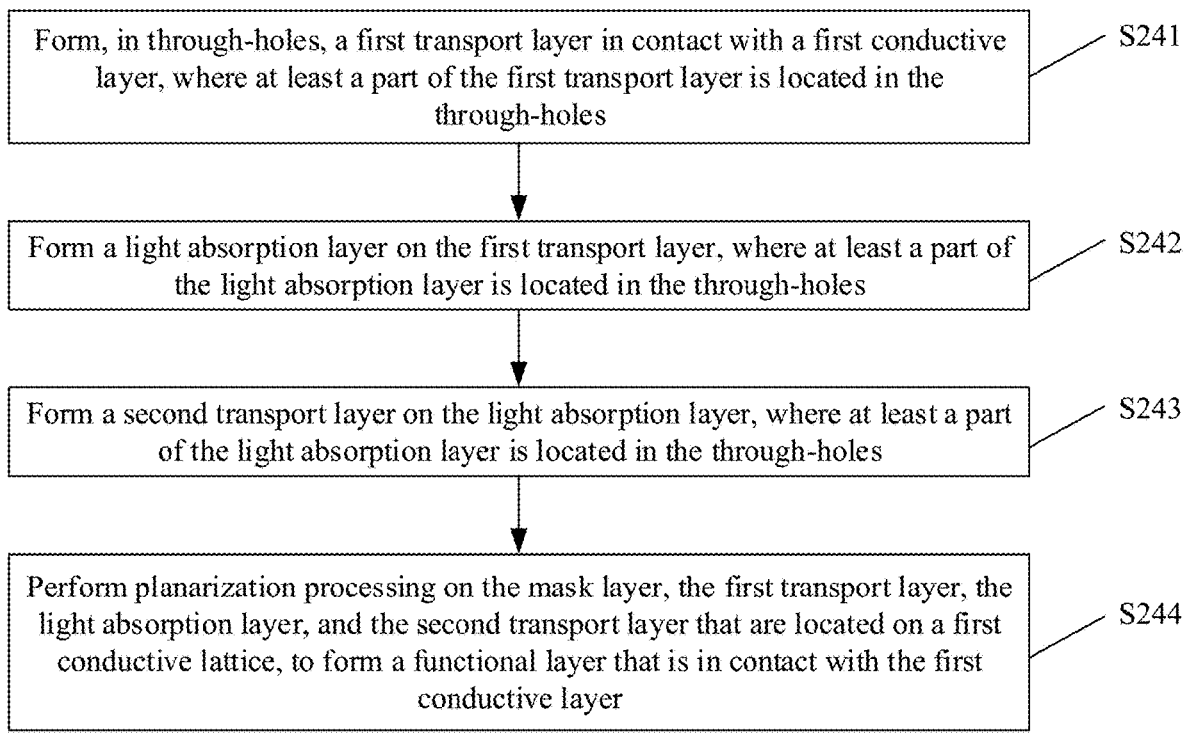
FIG. 25 is a schematic flowchart of operation S240 of the method for preparing a solar cell shown in FIG. 20.
Figure 26:
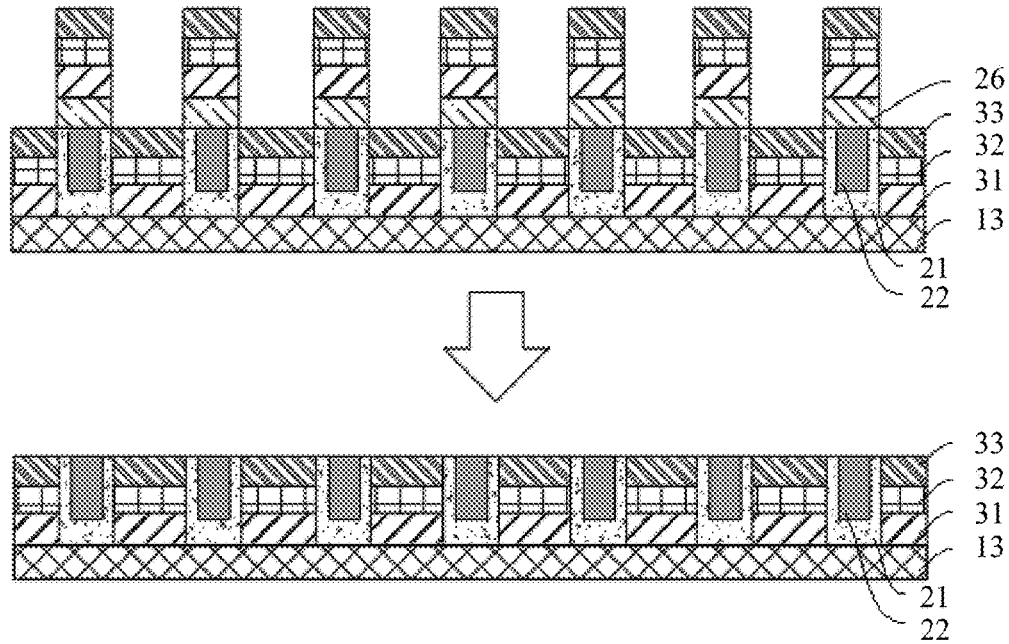
FIG. 26 is a schematic operation flowchart of operation S240 of the method for preparing a solar cell shown in FIG. 25.

In embodiments, as shown in FIG. 21, FIG. 23, and FIG. 24, operation S230 may include at least operations S231, S232, and S233. Details are as follows.

S231. Form a photoresist layer 25 on the second conductive layer 23 and the second conductive lattice 22.

For example, the photoresist layer 25 may be formed on the second conductive layer 23 and the second conductive lattice 22 through spin coating or the like.

S232. Perform exposure and development processing on the photoresist layer 25 to form a patterned mask layer 26.

S233. Etch the original insulation layer 24 by using the mask layer 26 as a mask, to form the insulation layer 21 that wraps the second conductive lattice 22, where the insulation layer 21 has a plurality of through-holes 213.

S240. Form, in the plurality of through-holes 213, the functional layer 30 that is in contact with the first conductive layer 13.

In embodiments, as shown in FIG. 21, FIG. 24, FIG. 25, and FIG. 26, operation S240 may include at least operations S241, S242, S243, and S244. Details are as follows.

S241. Form, in the through-holes 213, a first transport layer 31 in contact with the first conductive layer 13, where at least a part of the first transport layer 31 is located in the through-holes 213.

It can be understood that the first transport layer 31 may be partially located in the through-holes 213 and partially located on the mask layer 26 that is not removed from the second conductive lattice 22 in the foregoing operation.

For example, when the solar cell 100 is a perovskite solar cell, the first transport layer 31 may be prepared by using a sol-gel process, and the first transport layer 31 may be modified by using diethanolamine (DEA). A material of the first transport layer 31 may be NiO. When the solar cell 100 is an organic solar cell, a material of the first transport layer 31 may be ZnO. A thickness of the first transport layer 31 may vary depending on specific application of the solar cell 100 (such as a perovskite solar cell, an organic solar cell, or a quantum dot solar cell), and may be adjusted based on an actual application scenario. This is not strictly limited.

In a possible embodiment, before operation S241, another first conductive layer 13 may be further formed in the through-holes 213.

S242. Form a light absorption layer 32 on the first transport layer 31, where at least a part of the light absorption layer 32 is located in the through-holes 213.

It can be understood that the light absorption layer 32 may be partially located on the first transport layer 31 on the first conductive lattice 12 that is in the through-holes 213 in the foregoing operation, and partially located on the mask layer 26 that is not removed from the second conductive lattice 22 in the foregoing operation.

For example, when the solar cell 100 is a perovskite solar cell, the light absorption layer 32 may be prepared by using a two-operation process. A material of the light absorption layer 32 may be CH3NH3PbI3. When the solar cell 100 is an organic solar cell, a material of the light absorption layer 32 may be PM6:BTP-BO-4Cl. A thickness of the light absorption layer 32 may vary depending on specific application of the solar cell 100 (such as a perovskite solar cell, an organic solar cell, or a quantum dot solar cell), and may be adjusted based on an actual application scenario. This is not strictly limited.

S243. Form a second transport layer 33 on the light absorption layer 32, where at least a part of the light absorption layer 32 is located in the through-holes 213.

It can be understood that the second transport layer 33 may be partially located on the light absorption layer 32 on the first conductive lattice 12 that is in the through-holes 213 in the foregoing operation, and partially located on the mask layer 26 that is not removed from the second conductive lattice 22 in the foregoing operation.

For example, when the solar cell 100 is a perovskite solar cell, a material of the second transport layer 33 may be C60(CH2)(Ind). When the solar cell 100 is an organic solar cell, a material of the second transport layer 33 may be MoO3. A thickness of the second transport layer 33 may vary depending on specific application of the solar cell 100 (such as a perovskite solar cell, an organic solar cell, or a quantum dot solar cell), and may be adjusted based on an actual application scenario. This is not strictly limited.

In a possible embodiment, after operation S243, a second conductive layer 23 may be further formed in the through-holes 213.

S244. Perform planarization processing on the mask layer 26, the first transport layer 31, the light absorption layer 32, and the second transport layer 33 that are located on the second conductive lattice 22, to form the functional layer 30 that is in contact with the first conductive layer 13.

S250. Form the second conductive layer 23 that covers the functional layer 30 and is in contact with the second conductive lattice 22.

For example, when the solar cell 100 is a perovskite solar cell, the second conductive layer 23 may include PN4N, Ag, and MoO3 that are laminated sequentially on the functional layer 30 and the second conductive lattice 22. When the solar cell 100 is an organic solar cell, the second conductive layer 23 may include Al, Ag, and MoO3 that are laminated sequentially on the functional layer 30 and the second conductive lattice 22. A thickness of the second conductive layer 23 may vary depending on specific application of the solar cell 100 (such as a perovskite solar cell, an organic solar cell, or a quantum dot solar cell), and may be adjusted based on an actual application scenario. This is not strictly limited.

Based on the foregoing description, it should be understood that in the structure of the solar cell 100 proposed in this method, in terms of a preparation sequence, the first conductive lattice 12 and the second conductive lattice 22 may be preferentially prepared, and then the functional layer 30 is filled in a spacing region C of the insulation layer 21. This structure avoids problems of insufficient mechanical adhesion and poor electrical contact commonly encountered when a conductive lattice electrode is hot pressed on a prepared cell as a transparent top electrode by using a lamination method. Therefore, this also avoids a problem of low charge extraction efficiency or energy level matching of an active material possibly caused when a conductive adhesive (for example, PEDOT:PSS/sorbitol) with a relatively large thickness is usually used to provide mechanical adhesion and an electrical contact function, so as to improve carrier extraction efficiency and the like. In addition, a preparation process is simple. This helps reduce preparation costs and makes it possible to prepare an efficient large-area solar cell 100.

Embodiments of this application are described in detail above. The principle and implementation of this application are described herein through specific examples. The descriptions about embodiments are merely provided to help understand the method and core ideas of this application. In addition, a person of ordinary skill in the art can make variations and modifications to this application in terms of the specific implementations and application scopes according to the ideas of this application. Therefore, the content of this specification shall not be construed as a limit to this application.

What is claimed is:

1. A solar cell, comprising:
a first conductive layer, a second conductive layer, and a functional layer, wherein the first conductive layer and the second conductive layer are disposed in a laminated manner, the functional layer is disposed between the first conductive layer and the second conductive layer, the functional layer is configured to absorb light and generate a photocurrent, and both the first conductive layer and the second conductive layer are configured to receive the photocurrent generated by the functional layer;
a first conductive lattice, wherein a side of the first conductive lattice is in contact with a surface that is of the first conductive layer and that faces away from the functional layer, and the first conductive lattice is configured to output the photocurrent to a target device;
a second conductive lattice, wherein the second conductive lattice is embedded in the functional layer, one surface of the second conductive lattice is in contact with the second conductive layer, and the second conductive lattice is configured to output the photocurrent to the target device; and
an insulation layer that wraps the second conductive lattice.

2. The solar cell according to claim 1, wherein conductivity of the first conductive lattice is higher than conductivity of the first conductive layer, and conductivity of the second conductive lattice is higher than conductivity of the second conductive layer.

3. The solar cell according to claim 1, wherein the solar cell further comprises a transparent layer, the transparent layer is in contact with a surface that is of the first conductive layer and that is away from the functional layer, and the first conductive lattice is embedded in the transparent layer.

4. The solar cell according to claim 3, wherein a ratio of an area of a positive projection of the first conductive lattice onto the first conductive layer to an area of a positive projection of the transparent layer onto the first conductive layer is in a range of 0% to 20%.

5. The solar cell according to claim 3, wherein the transparent layer comprises a substrate and a colloidal layer, the colloidal layer is located between the first conductive layer and the substrate, and the first conductive lattice is embedded in the colloidal layer.

6. The solar cell according to claim 1, wherein the insulation layer has a plurality of through-holes, and the functional layer is located in the plurality of through-holes.

7. The solar cell according to claim 6, wherein at least a part of the first conductive layer is located in the plurality of through-holes, or at least a part of the second conductive layer is located in the plurality of through-holes.

8. The solar cell according to claim 6, wherein the functional layer comprises a first transport layer, a light absorption layer, and a second transport layer that are sequentially disposed in a laminated manner, the first transport layer is in contact with the first conductive layer, the second transport layer is in contact with the second conductive layer, one of the first transport layer and the second transport layer is configured to transport electrons, and the other is configured to transport holes.

9. The solar cell according to claim 1, wherein a thickness of the second conductive lattice is less than or equal to a thickness of the first conductive lattice.

10. A method for preparing a solar cell, comprising:
preparing a first conductive lattice and a first conductive layer configuring the first conductive lattice to be in contact with the first conductive layer, wherein the first conductive layer is configured to receive a photocurrent generated by a functional layer, and the first conductive lattice is configured to output the photocurrent to a target device; and
preparing a second conductive lattice, a second conductive layer, an insulation layer, and the functional layer on the first conductive layer, wherein the second conductive layer and the first conductive layer are disposed in a laminated manner, the functional layer is disposed between the first conductive layer and the second conductive layer, the second conductive lattice is embedded in the functional layer, one surface of the second conductive lattice is in contact with the second conductive layer, the functional layer is configured to absorb light and generate the photocurrent, the second conductive layer is configured to receive the photocurrent generated by the functional layer, the second conductive lattice is configured to output the photocurrent to the target device, and the insulation layer is configured to wrap the second conductive lattice.

11. The method according to claim 10, wherein the preparing the first conductive lattice and the first conductive layer comprises:
providing a transparent layer;
forming the first conductive lattice embedded in the transparent layer, wherein at least a part of the first conductive lattice is exposed on the transparent layer; and
forming the first conductive layer that covers the transparent layer and is in contact with the first conductive lattice.

12. The method according to claim 10, wherein the preparing the second conductive lattice, the second conductive layer, and the functional layer on the first conductive layer comprises:
forming an original insulation layer on a side that is of the first conductive layer and that is away from the first conductive lattice;
forming the second conductive lattice embedded in the original insulation layer, wherein at least a part of the second conductive lattice is exposed on the original insulation layer;
etching the original insulation layer to form an insulation layer that wraps the second conductive lattice, wherein the insulation layer has a plurality of through-holes;
forming, in the plurality of through-holes, the functional layer that is in contact with the first conductive layer; and
forming the second conductive layer that covers the functional layer and is in contact with the second conductive lattice.

13. Smart glasses, wherein the smart glasses comprise an electronic component and the solar cell according to claim 1, and the solar cell is configured to supply power to the electronic component.

14. An electronic device, wherein the electronic device comprises an electrical module and the solar cell according to claim 1, and the solar cell is configured to supply power to the electrical module.

* * * * *